US010234969B2

(12) United States Patent
Gaynor et al.

(10) Patent No.: US 10,234,969 B2
(45) Date of Patent: Mar. 19, 2019

(54) METHOD OF FORMING A COMPOSITE CONDUCTIVE FILM

(71) Applicant: Sinovia Technologies, Foster City, CA (US)

(72) Inventors: Whitney Gaynor, Menlo Park, CA (US); George Burkhard, Redwood City, CA (US)

(73) Assignee: Sinovia Technologies, Foster City, CA (US)

( * ) Notice: Subject to any disclaimer, the term of this patent is extended or adjusted under 35 U.S.C. 154(b) by 0 days.

(21) Appl. No.: 15/494,800

(22) Filed: Apr. 24, 2017

(65) Prior Publication Data
US 2017/0228055 A1    Aug. 10, 2017

Related U.S. Application Data

(60) Division of application No. 14/486,775, filed on Sep. 15, 2014, now Pat. No. 9,666,337, which is a
(Continued)

(51) Int. Cl.
*H01B 13/00* (2006.01)
*G03F 7/16* (2006.01)
(Continued)

(52) U.S. Cl.
CPC ............. *G06F 3/041* (2013.01); *B05D 3/007* (2013.01); *B82Y 10/00* (2013.01); *B82Y 40/00* (2013.01);
(Continued)

(58) Field of Classification Search
CPC ..... B05D 3/007; G06F 3/041; H01B 13/0013; H01B 1/22; H01G 5/14
See application file for complete search history.

(56) References Cited

U.S. PATENT DOCUMENTS 8,094,247 B2    1/2012  Allemand
2004/0023253 A1  2/2004  Kunwar
(Continued)

FOREIGN PATENT DOCUMENTS

EP          1508453 A2   2/2005
WO    WO 2004/053593 A2  6/2004
(Continued)

OTHER PUBLICATIONS

ASTM D 3363—05 Standard Test Method for Film hardness by Pencil Test.
(Continued)

*Primary Examiner* — Dah-Wei D. Yuan
*Assistant Examiner* — Jose Hernandez-Diaz
(74) *Attorney, Agent, or Firm* — Morgan, Lewis & Bockius LLP

(57) ABSTRACT

A method of fabricating a composite conductive film is provided. The method includes providing, as a matrix, a layer of cross-linkable polymer, where the cross-linkable polymer is in a non-cross-linked state. The method further includes introducing inorganic nanowires upon a surface of the layer of cross-linkable polymer. The inorganic nanowires are, in isolated form, characterized by a first conductivity stability temperature. The method further includes embedding at least some of the inorganic nanowires into the layer of cross-linkable polymer to form an inorganic mesh, thereby forming the composite conductive film. The method further includes cross-linking the polymer within a surface portion of the composite conductive film. Cross-linking the polymer within the surface portion of the composite conductive film results in the surface portion having a second conductivity stability temperature that is greater than the first conductivity stability temperature.

7 Claims, 12 Drawing Sheets

Related U.S. Application Data continuation-in-part of application No. 14/205,001, filed on Mar. 11, 2014, now abandoned.

(60) Provisional application No. 61/949,727, filed on Mar. 7, 2014, provisional application No. 61/792,924, filed on Mar. 15, 2013.

(51) Int. Cl.

| | | |
|---|---|---|
| *G03F 7/004* | (2006.01) | |
| *H05K 3/10* | (2006.01) | |
| *G06F 3/041* | (2006.01) | |
| *H05K 1/02* | (2006.01) | |
| *H05K 1/09* | (2006.01) | |
| *H05K 1/03* | (2006.01) | |
| *B82Y 10/00* | (2011.01) | |
| *B82Y 40/00* | (2011.01) | |
| *G03F 7/00* | (2006.01) | |
| *H01B 1/22* | (2006.01) | |
| *G06F 3/044* | (2006.01) | |
| *B05D 3/00* | (2006.01) | |
| *G03F 1/24* | (2012.01) | |
| *H01B 5/14* | (2006.01) | |
| *H01L 51/44* | (2006.01) | |
| *H01L 51/52* | (2006.01) | |
| *G03F 7/038* | (2006.01) | |
| *B82Y 20/00* | (2011.01) | |

(52) U.S. Cl.
CPC .............. *G03F 1/24* (2013.01); *G03F 7/0002* (2013.01); *G03F 7/0047* (2013.01); *G03F 7/161* (2013.01); *G06F 3/044* (2013.01); *H01B 1/22* (2013.01); *H01B 5/14* (2013.01); *H01B 13/0013* (2013.01); *H05K 1/0271* (2013.01); *H05K 1/0274* (2013.01); *H05K 1/036* (2013.01); *H05K 1/09* (2013.01); *H05K 3/103* (2013.01); *B82Y 20/00* (2013.01); *G03F 7/038* (2013.01); *G03F 7/0388* (2013.01); *G06F 2203/04103* (2013.01); *H01L 51/444* (2013.01); *H01L 51/5203* (2013.01); *H05K 2201/0108* (2013.01); *H05K 2201/0137* (2013.01); *H05K 2203/10* (2013.01); *Y10T 428/24355* (2015.01); *Y10T 442/188* (2015.04); *Y10T 442/191* (2015.04)

(56) References Cited

U.S. PATENT DOCUMENTS

| | | |
|---|---|---|
| 2008/0259262 A1 | 10/2008 | Jones |
| 2009/0129004 A1 | 5/2009 | Gruner |
| 2011/0018424 A1 | 1/2011 | Takada |
| 2011/0256451 A1 | 10/2011 | Cui |
| 2011/0281070 A1 | 11/2011 | Mittal |
| 2012/0127097 A1 | 5/2012 | Gaynor |
| 2012/0132930 A1 | 5/2012 | Young |
| 2013/0056244 A1* | 3/2013 | Srinivas .................. G06F 3/041 174/250 |
| 2013/0126799 A1 | 5/2013 | Naoi |
| 2015/0029411 A1 | 1/2015 | Kuo |
| 2015/0144380 A1 | 5/2015 | Yang |

FOREIGN PATENT DOCUMENTS

| | | |
|---|---|---|
| WO | WO 2004/061006 A1 | 7/2004 |
| WO | WO 2008/046058 A2 | 4/2008 |
| WO | WO 2011/106438 A2 | 9/2011 |
| WO | WO 2011/162322 A2 | 12/2011 |
| WO | WO 2012/016146 A1 | 2/2012 |

OTHER PUBLICATIONS

Cheng, Yin, et al., "Copper Nanowire Based Transparent Conductive Films with High Stability and Superior Stretchability", J. of Materials Chem. C, 2014, vol. 2, p. 5309-5316.

\* cited by examiner

METHOD OF FORMING A COMPOSITE CONDUCTIVE FILM

CROSS REFERENCE TO RELATED APPLICATIONS

This application is divisional application of U.S. patent application Ser. No. 14/486,775, entitled "Composite Conductive Films with Enhanced Thermal Stability," filed Sep. 15, 2014, which is a continuation-in-part of U.S. patent application Ser. No. 14/205,001, filed Mar. 11, 2014, which, in turn, claims priority to U.S. Provisional Patent Application No. 61/792,924, filed Mar. 15, 2013, entitled "Photoactive Transparent Conductive Films Patterned Via Abbreviated Photolithography," and U.S. Provisional Patent Application No. 61/949,727, filed Mar. 7, 2014, entitled "Photoactive Transparent Conductive Films," both of which are hereby incorporated by reference in their entirety.

This application is also related to U.S. patent application Ser. No. 13/194,134, filed Jul. 29, 2011, entitled "Conductive Films"; and U.S. patent application Ser. No. 14/486,815, filed Sep. 15, 2014, entitled "Composite Conductive Films with Enhanced Surface Hardness," now U.S. Pat. No. 9,491,853; each of which is hereby incorporated by reference in its entirety.

TECHNICAL FIELD

The disclosed embodiments relate generally to transparent conductive films and, more particularly, to composite transparent conductive films that are imparted with the properties of a matrix material employed therein (e.g., a property such as photoactivity, hardness, and/or thermal stability).

BACKGROUND

The embodiments described below relate to conductive surfaces and/or films with enhanced hardness properties and/or temperature stability.

Hardness is a measure of a material's ability to resist scratching and/or indentation. Materials with harder surfaces are often better able to withstand certain types of wear and damage, and thus are more durable and desirable in many applications. Conventional methods of enhancing the surface hardness of a material include depositing a hard layer on top of a softer surface. But when the surface needs to be accessible (e.g., because it has a certain property), covering the surface is not feasible. For example, an electrically conducting surface cannot be covered if future access to the surface is needed. Thus, there is a need for materials and/or films that have hard electrically conducting surfaces.

Likewise, there are many applications in which it is desirable to have inexpensive conductive films. Conventional conductive films, however, provide less than satisfactory temperature stability. One consequence of poor temperature stability is that the conductivity properties of such films are often destroyed when the films get too hot.

SUMMARY

Disclosed are composite conductive films, methods of fabricating composite conductive films, and devices that incorporate composite conductive films. More particularly, the composite conductive films described herein have a surface that is electrically conducting with enhanced hardness properties and/or temperature stability.

In particular, to address the aforementioned problems with conventional composite conductive films, the disclosed embodiments provide a composite conductive film with enhanced hardness properties. The composite conductive film includes a layer of cross-linked polymer having a surface and an inorganic mesh comprising a plurality of inorganic nanowires. The plurality of inorganic nanowires is embedded throughout at least a region of the layer of cross-linked polymer. The region is continuous from the surface of the layer of cross-linked polymer. The layer of cross-linked polymer and the inorganic mesh are arranged to form the composite conductive film. The composite conductive film has a pencil test hardness in a range of 2H to 9H.

In some embodiments, respective nanowires of the plurality of nanowires of the inorganic mesh comprise a material having a conductivity between $1 \times 10^5$ S/cm and $1 \times 10^6$ S/cm, or greater. In some embodiments, the inorganic nanowires comprise a metallic material.

In some embodiments, the plurality of nanowires has an average aspect ratio of the nanowires between 10-1000.

In some embodiments, the layer of cross-linked polymer comprises one of an acrylated polyurethane or an epoxy-based alkyl-amine.

In some embodiments, the composite conductive film is disposed on a substrate. The substrate is one of a polyester substrate or a borosilicate glass substrate.

In some embodiments, the layer of cross-linked polymer comprises a polymer that undergoes cross-linking when exposed to one of ultraviolet (UV) radiation, heat treatment, or a chemical catalyst.

In some embodiments, the respective inorganic nanowires of the plurality of inorganic nanowires are fused to form a substantially continuous network over a continuous portion of the composite conductive film. In some embodiments, the substantially continuous network of the inorganic nanowires is confined to the region of the layer of cross-linkable polymer that is continuous from the surface, thereby forming a substantially two-dimensional continuous network of the inorganic nanowires at the surface of the layer of cross-linkable polymer.

In some embodiments, the respective inorganic nanowires of the plurality of inorganic nanowires are metallic. Further, the plurality of nanowires is characterized by a density within the region that is above a two-dimensional percolation threshold and less than a bulk percolation threshold of the inorganic nanowires suspended throughout the layer of cross-linkable polymer.

In some embodiments, the surface region has a thickness. The composite conductive film is characterized by a first surface roughness that is less than a second surface roughness of a stand-alone film consisting of the same thickness of the inorganic nanowires. In some embodiments, the first surface roughness is about fifty percent less than the second surface roughness. In some embodiments, the thickness of the region is selected in accordance with a predetermined target conductivity value.

In some embodiments, the composite conductive film is bendable to a bending radius of at least 0.5 millimeters (mm).

Further, to address the aforementioned problems with conventional composite conductive films, the present disclosure provides a method of fabricating a composite conductive film with enhanced surface hardness. The method includes providing, as a matrix, a layer of cross-linkable polymer. The cross-linkable polymer is in a substantially noncross-linked state. The method further includes introducing a plurality of inorganic nanowires onto a surface of the layer of cross-linkable polymer. The method further includes embedding at least some of the plurality of inorganic nanowires into the layer of cross-linkable polymer to form an inorganic mesh within the layer of cross-linkable polymer, thereby forming the composite conductive film. The method further includes cross-linking the cross-linkable polymer within at least a surface portion of the composite conductive film. Following the cross-linking, the cross-linkable polymer within at least the surface portion of the composite conductive film is in a cross-linked state. Further, cross-linking the cross-linkable polymer within at least the surface portion of the composite conductive film results in a surface pencil test hardness of the composite conductive film that is between 2H and 9H.

This method is, in some embodiments, used to produce, fabricate and/or manufacture any of the composite conductive films described herein.

Further, to address the aforementioned problems with conventional composite conductive films, the disclosed embodiments provide a composite conductive film with enhanced temperature stability. The composite conductive film includes a layer of cross-linked polymer having a surface and an inorganic mesh comprising a plurality of nanowires of an inorganic material. The nanowires are, in isolated form, characterized by a first conductivity stability temperature. The plurality of nanowires is embedded within at least a region of the layer of cross-linked polymer, where the region is continuous from the surface of the layer of cross-linked polymer. The layer of cross-linked polymer and the inorganic mesh are arranged to form the composite conductive film having a second conductivity stability temperature that is greater than the first conductivity stability temperature.

In some embodiments, the composite conductive film is characterized by a sheet resistance that is substantially constant as a function of temperature between room temperature and the second conductivity stability temperature.

In some embodiments, the composite conductive film is characterized by a sheet resistance having a temperature coefficient that is less than $0.002$ $(\Omega K)^{-1}$ between the first conductivity and the second conductivity stability temperature.

In some embodiments, the layer of cross-linked polymer comprises one of a silicone material, a polyamide material, or a polyimide material.

In some embodiments, the layer of cross-linked polymer comprises a polymer that undergoes cross-linking when exposed to one of ultraviolet (UV) radiation, heat treatment, or a chemical catalyst.

In some embodiments, the respective nanowires of the plurality of nanowires are fused to form a substantially continuous network over a continuous portion of the composite conductive film. In some embodiments, the substantially continuous network of the nanowires is confined to the region of the layer of cross-linked polymer that is continuous from the surface, thereby forming a substantially two-dimensional continuous network of the inorganic nanowires at the surface of the layer of cross-linked polymer.

In some embodiments, the inorganic nanowires comprise a metallic material. In some embodiments, the respective inorganic nanowires of the plurality of inorganic nanowires are metallic. Furthermore, the plurality of nanowires is characterized by a density within the region that is above a two-dimensional percolation threshold and less than a bulk percolation threshold of the inorganic nanowires suspended throughout the layer of cross-linkable polymer.

Further, to address the aforementioned problems with conventional composite conductive films, the present disclosure provides a method of fabricating a composite conductive film with enhanced surface hardness. The method includes providing, as a matrix, a layer of cross-linkable polymer, wherein the cross-linkable polymer is in a non-cross-linked state. The method further includes introducing a plurality of inorganic nanowires upon a surface of the layer of cross-linkable polymer. The inorganic nanowires are, in isolated form, characterized by a first conductivity stability temperature. The method further includes embedding at least some of the plurality of inorganic nanowires into the layer of cross-linkable polymer to form an inorganic mesh within the layer of cross-linkable polymer, thereby forming the composite conductive film. The method further includes cross-linking the cross-linkable polymer within at least a surface portion of the composite conductive film. Following the cross-linking, the cross-linkable polymer within at least the surface portion of the composite conductive film is in a cross-linked state. Cross-linking the cross-linkable polymer within at least the surface portion of the composite conductive film results in at least the surface portion of the composite conductive film having a second conductivity stability temperature that is greater than the first conductivity stability temperature.

This method is, in some embodiments, used to produce, fabricate and/or manufacture any of the composite conductive films described herein.

BRIEF DESCRIPTION OF THE DRAWINGS

Like reference numerals refer to corresponding parts throughout the drawings.

DESCRIPTION OF EMBODIMENTS

Figure 1A:
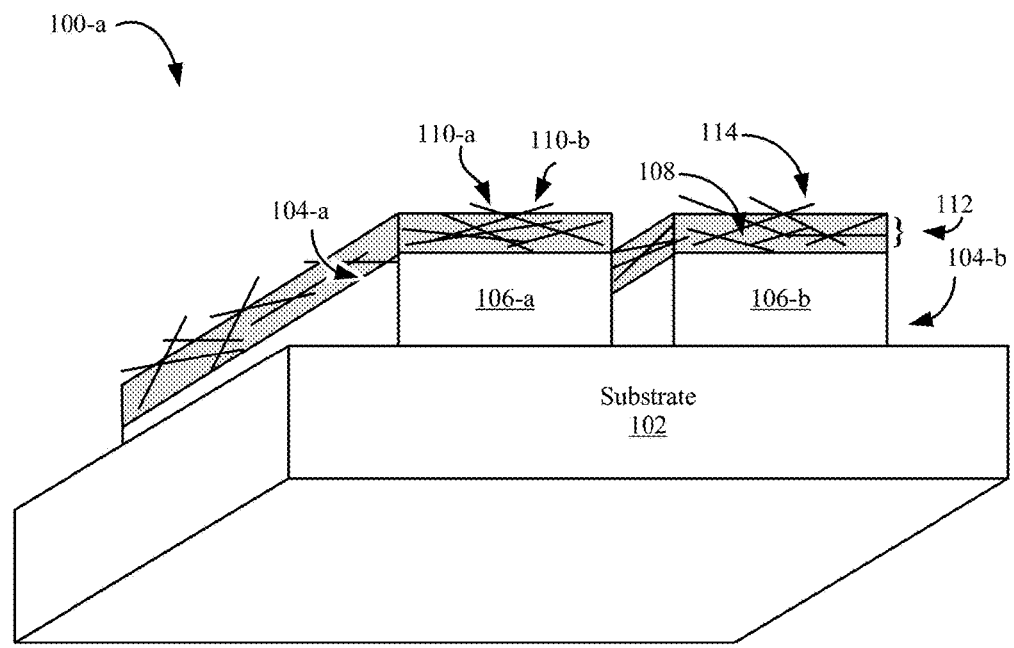
FIG. 1A illustrates a perspective view of a device that includes a transparent conductive film, in accordance with some embodiments.

The embodiments described herein provide composite conductive films that may be implemented in connection with many different types of devices, in accordance with various embodiments. These composite conductive films include a layer of organic material (e.g., a polymer) and an inorganic conductive material (e.g., metallic nanowires). The polymer holds the wires in place mechanically and also allows the junctions between wires to be embedded within, resulting in a smooth surface (which is beneficial for building thin-film devices and other applications where surface-roughness is an issue). Moreover, the polymer is chosen based on additional useful properties and/or functionality, resulting in composite conductive films that are imparted with the same properties and/or functionalities as the polymer.

While other properties will be apparent to one of ordinary skill in the art, the present disclosure focuses on three types of composite conductive films that benefit from properties obtained from the polymer: (1) photo-active transparent conductive films; (2) composite conductive films with enhanced hardness/durability; and (3) composite conductive films with enhanced temperature stability. These composite conductive films may be used in a variety of applications. For example, thin film solar cells, displays such as liquid crystal displays (LCDs), organic light-emitting displays, electrophoretic displays, touch screens (e.g., capacitive or resistive), anti-fog devices such as in automotive and aeronautic windshields, flexible flat-panel lighting (e.g., using evaporated and/or printed white organic light-emitting diodes), or photo-detectors can be formed (and optionally patterned) using materials and/or approaches as described herein.

Regarding photoactive transparent conductive films, conventional photoresists are poor conductors of electricity. One way to improve the electrical conductivity (hereinafter "conductivity") of a conventional photoresist is to disperse conductive particles throughout the photoresist. This can be done, for example, by dissolving the conductive particles in a solution along with the photoresist prior to application of the photoresist (e.g., onto a wafer or a chip). Above a so-called "percolation threshold" (e.g., a percolation threshold density of the conductive particles), an electrically coupled network is formed by the conductive particles through which electrical currents can move, resulting in a low sheet resistance. An exact cutoff sheet resistance between electrically conducting and electrically insulating films is somewhat subjective and application specific but, generally speaking, a film with a sheet resistance less than 100 $\Omega\square^{-1}$ ("ohms per square") may be considered conducting.

The problem with this approach (essentially loading a photoresist with so much conductive material that it becomes electrically conducting) is that appropriate conductive materials tend to absorb and/or scatter optical light, making such photoresist opaque and thus unsuitable for applications that require transparent conductive films. This is a primary reason that, despite the expensive nature of tin-doped indium oxide (ITO) and the difficulty in patterning ITO, ITO remains an industry standard for conductive transparent films. To be sure, the fact that ITO remains prevalent speaks to the elusive nature of suitable alternatives.

The embodiments described herein, however, provide photoactive transparent conductive films that are inexpensive and easy to pattern using abbreviated lithographic processes. The photoactive transparent conductive film is a composite conductive film that includes at least two parts: (1) a layer of photoresist material (e.g., forming a matrix material) and (2) an inorganic mesh made of a plurality of particles of an inorganic material. The plurality of particles of the inorganic mesh is embedded, for example, within the very surface of the layer of photoresist material to form a conductive film that is photoactive by virtue of the matrix material being a photoactive photoresist. By restricting the inorganic mesh to a surface region of the layer of photoresist material, absorption of light is greatly reduced. This is due to the fact that absorption by the conductive material occurs over a lesser extent of the film than if the conductive material was dispersed throughout the bulk of the film, as well as the fact that the percolation threshold for a substantially two-dimensional (2D) mesh of conductive material is less than the percolation threshold for a bulk, or three-dimensional (3D), mesh of conductive material. The latter effect reduces the density of conductive material needed in the surface region.

Since they are made using a photoresist matrix, these films can be patterned quite easily. Nearly any arbitrary shape down to sub-micron length-scales can be realized simply by exposing the film to light of an appropriate wavelength and developing the film in an appropriate developer. The resulting structure can be permanently or functionally incorporated as electrical components (e.g., wires or conductive lines) into devices such as displays, solar cells, and others. As an added benefit, photoresists tend not to be brittle, making the films disclosed herein suitable for flexible electronics. For example, in some embodiments, the composite conductive films described herein are bendable to a bending radius of at least 0.5 millimeters (mm).

Regarding composite conductive films with enhanced hardness and durability, there are numerous hard plastic materials (e.g., polymers) that can be used to increase the hardness and durability of the composite conductive films described herein. These plastic materials include the family of poly-acrylates and acrylated polyurethanes as well as epoxies based on alkyl amines. In accordance with some embodiments, a respective one of these materials, or a combination, is initially deposited onto a substrate as monomers or oligomers and is subsequently cross-linked by exposure to heat, exposure to ultraviolet radiation, and/or exposure to a chemical catalyst. More specifically, the composite film is made conductive by forming a nanowire network or mesh on a sacrificial superstrate and then laminating that superstrate onto the film of polymer. The polymer is then cross-linked by, for example, exposing it to ultraviolet (UV) radiation. The sacrificial superstrate is removed and the nanowires remain embedded into the surface of the film. The hardness of the cross-linked polymer translates into a composite conductive film that is correspondingly hard.

Hardness, in some circumstances, is quantified using a standardized pencil hardness test. This test is performed by pushing the tip of a pencil of known hardness across the surface of the film with a known force and at a fixed angle (e.g., 45 degrees) in the direction of the movement of the pencil. The standards for the standardized pencil test are maintained by the American Society for Testing and Materials (ASTM). When particular pencil test hardness values are given in the present disclosure, such values should be interpreted with respect to the pertinent ASTM standard as of the filling date of the present disclosure. *ASTM Standard D3363, 2011e2, "Standard Test Method for Film Hardness by Pencil Test,"* West Conshohocken, Pa., 2011, DOI: 10.1520/D3363-05R11E02, www.astm.org (this standard is herein incorporated by reference in its entirety).

Regarding composite conductive films with enhanced temperature stability, the use of polymers such as silicones, polyamides, and polyimides is utilized in some embodiments to create a composite conductive film that is heat-stabilized (i.e., the entire composite conductive film is heat stabilized, not just the polymer itself). This is of particular importance because many of the composite conductive films described herein make use of a mesh of inorganic nanowires that provides the conductivity. But because nanoparticles (e.g., nanowires) exhibit enhanced diffusion of surface atoms, they are less structurally stable than the corresponding bulk material (e.g., bulk metal). For example, while bulk silver has a melting point of 961° C., silver nanowires begin to lose structural stability at significantly lower temperatures, with smaller wires less stable at a given temperature than larger ones. Nanowires with an approximate diameter of 100 nanometers (nm) exhibit instability at about 200° C., while nanowires with an approximate diameter of 25 nm are unstable at 120° C. Above these temperatures, the nanowires "bead up" and no longer provide conductive pathways. By embedding the nanowire mesh in a cross-linked polymer, as described below, a nanowire mesh that would ordinarily (e.g., in isolation) be unstable at about 200° C. are stable to at least 350° C. (e.g., as indicated by their good conductive properties at 350° C.). One of ordinary skill in the art will appreciate that the exact stability temperature depends on the nature of the nanowires, including their size, shape, and composition.

As used herein, the term conducting should be construed to mean electrically conducting unless clearly stated otherwise.

Reference will now be made in detail to various implementations, examples of which are illustrated in the accompanying drawings. In the following detailed description, numerous specific details are set forth in order to provide a thorough understanding of the present disclosure and the described implementations herein. However, implementations described herein may be practiced without these specific details. In other instances, well-known methods, procedures, components, and mechanical apparatus have not been described in detail so as not to unnecessarily obscure aspects of the implementations.

FIG. 1A illustrates a perspective view of a device 100-a, in accordance with some embodiments. Device 100-a includes a substrate 102 that provides underlying support for the device 100-a. In some embodiments, the substrate 102 comprises glass or polyethylene terephthalate (PET). Device 100-a further includes distinct instances of a transparent conductive film 104 (e.g., transparent conductive films 104-a and 104-b) that are patterned upon the substrate 102. In some embodiments, the distinct instances of the transparent conductive film 104 form wires, conductive lines, or other electrical components of the device 100-a that are permanently and/or functionally incorporated into the device 100-a (e.g., in its end- or product-ready-state). For example, in some embodiments, the distinct instances of the transparent conductive film 104 form conductive lines for a touch screen device or electrical contacts for a solar cell.

The transparent conductive film 104 comprises a layer of photoresist material 106 (distinct instances of which are 106-a and 106-b). The term photoresist, as used herein, may be construed to mean any material that undergoes a structural or chemical change when exposed to a predetermined wavelength of light (or light within a predetermined range of wavelengths, such as optical light, ultraviolet light, etc.). These changes can facilitate the removal of undesired portions of the photoresist material by either (1) making exposed portions insoluble to removing agents (said removing agents are sometimes called "developers"), in which case the photoresist is considered a negative photoresist, or (2) making an insoluble portion of the photoresist soluble when exposed to light, in which case the photoresist is considered a positive photoresist. As described in greater detail later, the layer of photoresist material 106 can comprise either a positive photoresist or a negative photoresist. Selectively exposing the photoresist material to light thus enables one to fashion the transparent conductive film 104 according to a complex pattern (e.g., create distinct instances of the transparent conductive film 104) with high resolution (e.g., micron resolution or sub-micron resolution). In some embodiments, the photoresist material comprises an organic material. In some embodiments the photoresist is a negative photoresist. For example, in some embodiments, the layer of photoresist material 106 comprises poly(methyl methacrylate) (PMMA, sometimes called "acrylic glass"). Poly(methyl methacrylate) is photosensitive to deep ultraviolet (UV) light (e.g., light having a wavelength in a range of 200-270 nanometers (nm)). Exposure to deep UV light creates chain scissions that de-crosslink chains of PMMA, making the photoresist soluble in certain developers (thus, PMMA is a positive photoresist). In another example, in some embodiments the layer of photoresist material 106 comprises a photoresist provided by Kayaku Microchem, such as SU-8, which is a negative photoresist that is photosensitive to near ultraviolet light (e.g., light having a wavelength in a range of 300-400 nm). Other examples of negative resists that can be used include, but are not limited to, azidelisoprene negative resists, polymethylisopropyl ketone (PMIPK), poly-butene-1-sulfone (PBS), poly-(trifluoroethyl chloroacrylate) TFECA, copolymer-(V-cyano ethyl acrylate-V-amido ethyl acrylate) (COP), poly-(2-methyl pentene-1-sulfone) (PMPS) and the like. It should be understood, however, that the exact nature or chemical composition of the photoresist is not intended to limit the claims that follow. In fact, since photoresist are oftentimes proprietary in nature, the exact chemical composition or nature of the photoresist may not be known when practicing the present disclosure.

In some embodiments the photoresist is a positive photoresist. The positive resist is relatively insoluble. After exposure to the proper light energy, the resist converts to a more soluble state. This reaction is called photosobulization. One positive photoresist in accordance with the present disclosure is the phenol-formaldehyde polymer, also called phenol-formaldehyde novolak resin. See, for example, DeForest, Photoresist: Materials and Processes, McGraw-Hill, New York, 1975, which is hereby incorporated by reference herein in its entirety. In some embodiments, the resist layer is LOR OSA, LOR 5 0.7A, LOR1A, LOR 3A, or LOR 5A (MICROCHEM, Newton, Mass.). LOR lift-off resists use polydimethylglutarimide.

Figure 1B:
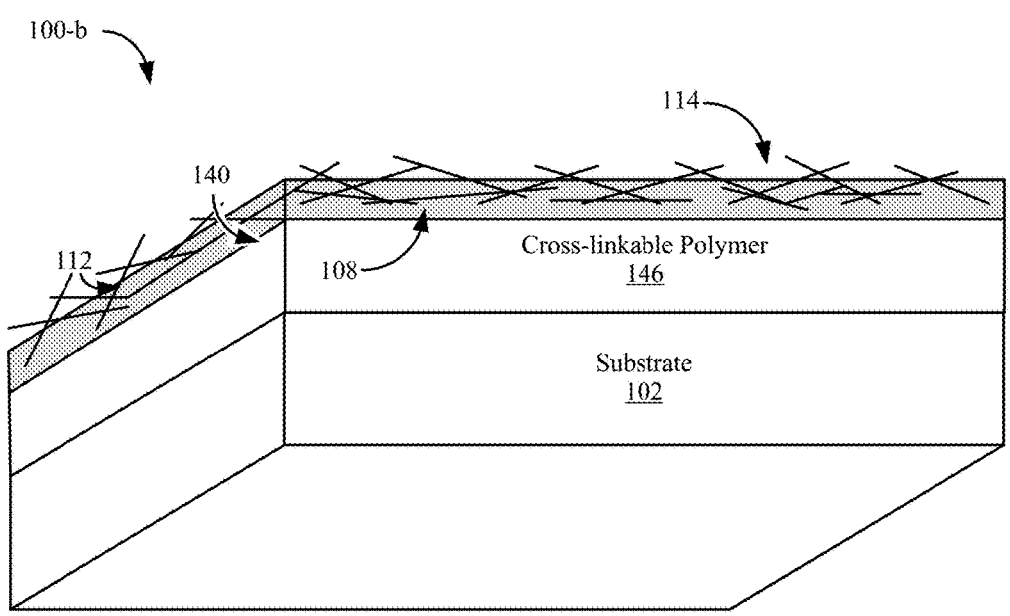
FIG. 1B illustrates a perspective view of a device that includes a composite conductive film with enhanced surface properties (e.g., hardness or temperature stability), in accordance with some embodiments.

FIG. 1B illustrates a perspective view of a device 100-b, in accordance with some embodiments. Device 100-b is more general than device 100-a. Device 100-b includes a substrate 102 (analogous to substrate 102 in FIG. 1A) that provides underlying support for the device 100-b. In some embodiments, the substrate 102 comprises glass or polyethylene terephthalate (PET). Device 100-b further includes a composite conductive film 140 that is disposed upon the substrate 102. In various embodiments, composite conductive film 140 has enhanced hardness/durability properties, thermal stability, and/or chemical stability that are imparted by the particular choice and/or treatment of a selected polymer 146. In some such cases, polymer 146 is a cross-linkable polymer (e.g., for applications in which an enhanced surface hardness is desirable). Specifically, in some embodiments, composite conductive film 140 has enhanced hardness properties (e.g., the composite conductive film has a pencil test hardness in a range of 2H to 9H) because polymer 146 includes polyacrylates, acrylated polyurethanes and/or alkyl amines. In some circumstances, the hardness is somewhat dependent on the nature (e.g., composition) of the substrate 102.

Alternatively, or in addition, in some embodiments composite conductive film 140 has enhanced thermal stability. This means that the particles 110 are, in isolated form, characterized by a first conductivity stability temperature (e.g., a temperature at which they melt or "bead up") and the composite conductive film (i.e., including the particles 110) have a second conductivity stability temperature that is greater than the first conductivity stability temperature. For example, in some circumstances the particles 110 are nanowires with a melting temperature of 200° C. but, when imbedded in a cross-linked polymer 110, are stable to at least 350° C.

In some embodiments, the particles 110 (e.g., comprising inorganic nanowires) are embedded into the surface 114 such that they make a conductive surface that is accessible to an agent that touches the surface without needing to penetrate through or into the surface 114. In some embodiments, the particles 110 are embedded throughout at least a region of the layer of cross-linked polymer. The region is continuous from and/or proximal to the surface 114.

In some embodiments, polymer 146 is a birefringent polymer, in which case polymer 146 can be used to make a composite conductive film 140 that also, for example, functions as a wave plate for use in LCD screens, Pockels cells, or other photon-polarization related applications. Birefringent polymers include polyester, polyethylene, nylon, and most polymers when deposited with built-in mechanical stress.

In some embodiments, polymer 146 is chosen for its index of refraction, thus modifying the index of refraction of the composite conductive film 140. The index of polymer 146 is chosen to match a substrate 102 or to tailor the properties of the composite conductive film 140 to enhance internal reflection or light out-coupling at certain wavelengths.

In some embodiments, a thermally insulating material (such as an aerogel) is chosen to be polymer 146. In some embodiments, composite conductive film 140 is used to make conductive materials that do not substantially transmit heat (or, stated another way, resist heat transfer). In some embodiments, composite conductive film 140 is used, e.g., in transparent displays used on refrigerator cases.

In some embodiments, a porous polymer is chosen to be polymer 146. In some embodiments, conductive composite film 140 is conductive yet allows gas to flow through it, e.g., for use in active contact lenses. Conductive composite films 140 made using porous polymers as polymer 146 can be designed to have specific surface chemistries to suit applications in chemical sensors.

In some embodiments, polymer 146 is chosen so as to impart chemical stability to the composite conductive film 140. For example, some polymers act to keep water from the nanowire surface by taking advantage of their hydrophobicity. Other polymers preferentially react with oxygen or sulfides so that those compounds are not available to react with the nanowires. As a specific example, in some embodiments, polymer 146 is chosen to comprise a polyacrylate (e.g., poly-methylmethacrylate) material so as to prevent oxidation of the composite conductive film 140, where the composite conductive film 140 includes a mesh of silver (Ag) nanowires. Because oxidation degrades the conductivity of the composite conductive film, loss of conductivity can be used as a metric to evaluate oxidative degradation of the silver network over time.

In the remaining description, certain properties are referred to that are applicable to either device 100-a or device 100-b. Thus, photoresist material 106 and polymer 146 are collectively referred to as "material 106/146"; while transparent conductive film 104 and composite conductive film 140 are collectively referred to as "composite conductive film 104/140." The descriptions of individual properties below are intended to be applicable to device 100-a and/or device 100-b, either alone or in combination with any other set of properties described below.

In some embodiments, material 106/146 is an electrically insulating material (e.g., the layer of material 106/146 has a sheet resistance above 5000 $\Omega\square^{-1}$).

In some embodiments, the layer of material 106/146 has a controllable thickness (e.g., a thickness that is controlled by process parameters during fabrication). For example, in some embodiments, the substrate 102 is a chip or a wafer and the layer of material 106/146 is applied to the chip or wafer by spin coating the material (e.g., polymer and/or photoresist) onto the substrate 102 and subsequently baking the material (e.g., to evaporate solvent). In such embodiments, the resulting thickness of the layer of material 106/146 depends on an angular speed of the spin coater (e.g., as measured in revolutions per minute) as well as the composition and viscosity of the material in dissolved form. In some embodiments, the thickness of the layer of material 106/146 is in a range of 100-500 nm, 400-1000 nm, 900-1500 nm, or 1-10 microns. In some embodiments, the layer of material 106/146 is deposited onto the substrate using another deposition technique such as the Spin-On-Glass method (SOG). More information on SOG can be found, for example, in Nguyen Nhu Toan, *Spin-On Glass Materials and Applications* in Advanced IC Technologies, 1999, which is hereby incorporated herein by reference in its entirety.

In some embodiments, the layer of material 106/146 is deposited onto the substrate using ink-jet printing. Ink-jet printing is based on the same principles of commercial ink-jet printing. The ink-jet nozzle is connected to a reservoir filled with the chemical solution and placed above a computer-controlled x-y stage. The target object is placed on the x-y stage and, under computer control, liquid drops (e.g., 50 microns in diameter) are expelled through the nozzle onto a well-defined place on the object. Different nozzles print different spots in parallel. In one embodiment of the present disclosure, a bubble jet, with drops as small as a few picoliters, is used to form a layer of the material 106/146. In another embodiment, a thermal ink jet (Hewlett Packard, Palo Alto, Calif.) is used to form a layer of a deposit material. In a thermal ink jet, resistors are used to rapidly heat a thin layer of liquid ink. A superheated vapor explosion vaporizes a tiny fraction of the ink to form an expanding bubble that ejects a drop of ink from the ink cartridge onto the substrate. In still another embodiment of the present disclosure, a piezoelectric ink-jet head is used for ink-jet printing. A piezoelectric ink-jet head includes a reservoir with an inlet port and a nozzle at the other end. One wall of the reservoir consists of a thin diaphragm with an attached piezoelectric crystal. When voltage is applied to the crystal, it contracts laterally, thus deflecting the diaphragm and ejecting a small drop of fluid from the nozzle. The reservoir then refills via capillary action through the inlet. One, and only one, drop is ejected for each voltage pulse applied to the crystal, thus allowing complete control over when a drop is ejected. In yet another embodiment of the present disclosure, an epoxy delivery system is used to deposit material 106/146. An example of an epoxy delivery system is the Ivek Digispense 2000 (Ivek Corporation, North Springfield, Vt.). For more information on jet spraying, see, for example, Madou, *Fundamentals of Microfabrication*, Second Edition, 2002, pp. 164-167, CRC Press, which is hereby incorporated by reference herein in its entirety.

In another embodiment of the present disclosure, the layer of material 106/146 is deposited onto the substrate by a screen printing (also known as silk-screening) process. A paste or ink is pressed onto portions of the substrate through openings in the emulsion on a screen. See, for example, Lambrechts and Sansen, *Biosensors: Microelectrochemical Devices*, The Institute of Physics Publishing, Philadelphia, 1992, which is hereby incorporated by reference in its entirety. The paste consists of a mixture of the material of interest, an organic binder, and a solvent. The organic binder determines the flow properties of the paste. The bonding agent provides adhesion of particles to one another and to the substrate. The active particles make the ink a conductor, a resistor, or an insulator. The lithographic pattern in the screen emulsion is transferred onto portions of the underlying structure by forcing the paste through the mask openings with a squeegee. In a first step, paste is put down on the screen. Then the squeegee lowers and pushes the screen onto the substrate, forcing the paste through openings in the screen during its horizontal motion. During the last step, the screen snaps back, the thick film paste that adheres between the screening frame and the substrate shears, and the printed pattern is formed on the substrate. The resolution of the process depends on the openings in the screen and the nature of the paste. With a 325-mesh screen (i.e., 325 wires per inch or 40 µm holes) and a typical paste, a lateral resolution of 100 µm can be obtained.

For difficult-to-print pastes, a shadow mask, such as a thin metal foil with openings, complements the process. However, the resolution of this method is inferior (>500 µm). After printing, the wet films are allowed to settle for a period of time (e.g., fifteen minutes) to flatten the surface while drying. This removes the solvents from the paste. Subsequent firing burns off the organic binder, metallic particles are reduced or oxidized, and glass particles are sintered. Typical temperatures range from 500° C. to 1000° C. After firing, the thickness of the resulting layer ranges from 10 µm to 50 µm. One silk-screening setup is the DEK 4265 (Universal Instrument Corporation, Binghamton, N.Y.). Commercially available inks (pastes) that can be used in the screen printing include conductive (e.g., Au, Pt, Ag/Pd, etc.), resistive (e.g., $RuO_2$, $IrO_2$), overglaze, and dielectric (e.g., $Al_2O_3$, $ZrO_2$). The conductive pastes are based on metal particles, such as Ag, Pd, Au, or Pt, or a mixture of these combined with glass. Resistive pastes are based on $RuO_2$ or $Bi_2Ru_2O_7$ mixed with glass (e.g., 65% PBO, 25% $SiO_2$, 10% $Bi_2O_3$).

The resistivity is determined by the mixing ratio. Overglaze and dielectric pastes are based on glass mixtures. Different melting temperatures can be achieved by adjusting the paste composition. See, for example, Madou, *Fundamentals of Microfabrication*, Second Edition, CRC Press, Boca Raton, Fla., 2002, pp. 154-156, which is hereby incorporated by reference herein in its entirety.

In some embodiments, the composite conductive film 104/140 is a transparent conductive film characterized by a low index of refraction (e.g., in a range of 1.5-2), obviating the need for anti-reflective coatings in certain applications (i.e., as compared to ITO when used in the same applications).

The composite conductive film 104/140 includes an inorganic mesh 108 embedded within the layer of material 106/146. The inorganic mesh 108 includes a plurality of particles 110 of an inorganic material. As shown in FIG. 1A, particle 110-*a* and particle 110-*b* are respective particles of the plurality of particles. For visual clarity, the remaining particles in FIGS. 1A-1B are not labeled. In some embodiments, the respective particles of the plurality of particles 110 comprise a conductive material. For example, in various embodiments, the plurality of particles 110 comprises inorganic nanowires (as shown in FIGS. 1A-1B), nanotubes, nanospheres, graphene, or a heterogeneous mixture thereof. In some embodiments, the nanowires are silver (Ag) nanowires. More generally, in some embodiments, the nanowires are metallic nanowires. In some embodiments, the nanotubes comprise carbon nanotubes (CNT). In some embodiments, the inorganic mesh 108 comprises a heterogeneous mixture of particles (e.g., a mixture of carbon nanotubes and graphene particles). In some embodiments, each nanowire or nanotube is characterized by a major axis and one or more minor axes. The major axes are aligned substantially parallel to a surface 114 of the layer of material 106/146. A typical width of a nanowire (i.e., along a respective minor axis of the nanowire) will be on the order of tens of nanometers, while the length (i.e., along the major axis of the nanowire) is often on the order of hundreds of nanometers or microns. In some embodiments, the nanowires have an average aspect ratio between 10-1000.

In some embodiments, the respective particles of the plurality of particles 110 are fused (e.g., electrically coupled) to form a substantially continuous network of the conductive material over a continuous portion of the composite conductive film (e.g., the respective particles of the plurality of particles 110 are fused to form a substantially continuous network over the conductive material over each instance of the composite conductive film 104/146). In other words, the respective particles of the plurality of particles 110 are fused in the sense that they form a continuous network of the conductive material. For example, the respective particles of the plurality of particles 110 may still be considered fused if the network includes dead-ends or if there are some particles or groups of particles that are not continuous with the network (e.g., islands of particles).

In some embodiments, the substantially continuous network of the conductive material is confined to a surface region 112 of the layer of material 106/146 (e.g., the surface region 112 has a thickness that is thin compared to the thickness of the layer of material 106/146), thereby forming a substantially two-dimensional continuous network of the conductive material proximal to the surface 114 of the layer of material 106/146. For example, in some circumstances, the thickness of the surface region 112 is 10, 20, 50, or 100 times thinner than the overall thickness the layer of material 106/146 (e.g., the thickness of the surface region 112 is 25 nm while the overall thickness of the layer of material 106/146 is 1 micron, giving a ratio of the thickness of the surface region 112 to the overall thickness of the layer of material 106/146 of 40).

More generally, the plurality of particles 110 (e.g., inorganic nanowires) is embedded throughout at least a region of the layer of material 106/146. The region should be construed to be a region in two- or three-dimensions unless otherwise specified. That is to say, in some embodiments, the region has a "footprint" that encompasses less than the entire surface area of the layer of cross-linked polymer and has a depth that is less than the entire depth of the layer of cross-linked polymer. In some embodiments, the region in which the inorganic mesh is embedded is restricted to a sub-layer of the layer of cross-linked polymer, where the sub-layer is continuous with the surface.

By confining the plurality of particles 110 to the surface region 112 (e.g., proximal to surface 114), some embodiments take advantage of the fact that the composite conductive film 104/140 can confer conductivity to surface region 112 using far fewer particles than would be otherwise required to make the material 106/146 as a whole conductive through dispersal of the particles throughout the bulk of the photoresist material. The reason for this is two-fold: (1) even if particles had the same density in both cases, fewer particles would be needed to achieve that density in a smaller region (e.g., the surface region 112 as compared to the bulk) and (2) the percolation threshold is lower for a two-dimensional (2D) network of particles than it is for a bulk, or three-dimensional (3D), network of particles. Thus, in some embodiments, the plurality of particles 110 is characterized by a density within the surface region 112 that is above the two-dimensional percolation threshold (corresponding to a 2D network of particles) and less than the bulk percolation threshold of the conductive material suspended throughout the layer of material 106/146. This is particularly advantageous in certain circumstances (e.g., when a high-degree of transparency is needed) because, in some embodiments, the respective particles of the plurality of particles 110 comprise metallic particles that tend to absorb and/or scatter optical light.

In some embodiments, the layer of material 106/146 is substantially transparent to optical light (e.g., light having a wavelength within a range of 400-700 nm). As used herein, the term "transparent" may be understood to refer to characteristics relating to the passage of at least some light as measured with respect to light from a light source having a predetermined spectral density. In some embodiments, the light source is the sun. Alternatively, the light source is a light source that emits a narrow band of light (e.g., a laser or light that has passed through a band pass filter). Alternatively, the light source is a common household light source, such as an incandescent light bulb or a compact fluorescent lamp (CFL). Regardless of the type of light source that is used to define transparency, different transparent materials (in accordance with different embodiments) exhibit different levels of transparency. For example, in some embodiments, the composite conductive film is characterized by a transparency to optical light in one or more of the following ranges: 60%-100%, 60%-99%, 60%-90%, and greater than 50%. In many optoelectronic implementations, the transparent conductive films pass between about 60% and 90% of incident light, as dictated by the application.

FIGS. 2A-2E illustrate a method 200 of fabricating (e.g., manufacturing) a composite conductive film (e.g., composite conductive film 104/140, FIGS. 1A-1B), in accordance with some embodiments. In various embodiments, the composite conductive film is a photoactive transparent conductive film and/or a film with enhanced surface properties (e.g., enhanced hardness and/or temperature stability). For ease of explanation, the method 200 is described with reference to a nanowire mesh (e.g., inorganic mesh 108, FIG. 1A) comprising a plurality of nanowires made of a conductive material. It should be understood, however, that the method 200 can be implemented using a variety of conductive materials, including but not limited to conductive nanowires, nanotubes, nanospheres, graphene, and/or a heterogeneous mixture thereof.

Figure 2A:
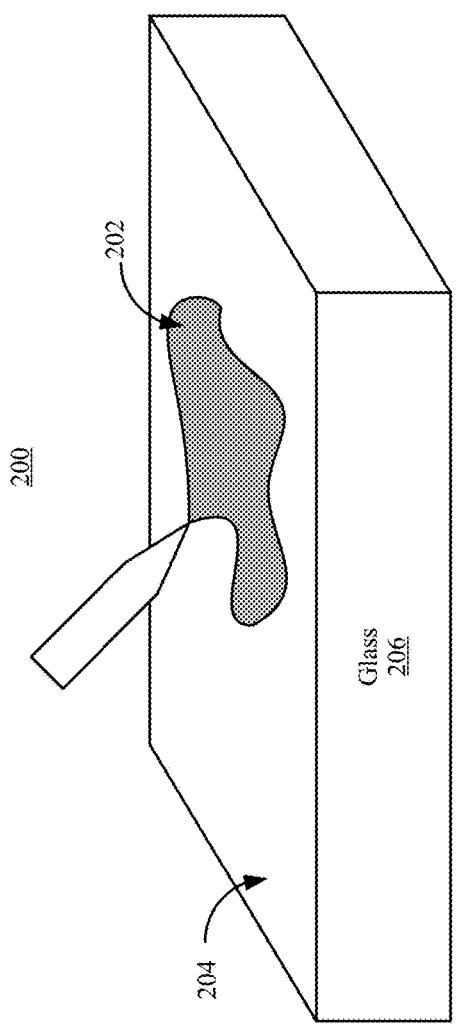
FIGS. 2A-2E illustrate a method of fabricating (e.g., manufacturing) a composite conductive film, in accordance with some embodiments.

FIG. 2A illustrates an operation in which a nanowire suspension 202 (e.g., comprising a solution of nanowires suspended in a solvent) is applied to (e.g., drop-cast onto) a surface 204 of a glass transfer block 206. The nanowire suspension 208 is applied, for example, in some embodiments, by mixing nanowires in the solution and coating or depositing the solution on the surface 204 of the glass transfer block 206. In alternate embodiments, the transfer block may comprise a material other than glass.

Figure 2B:
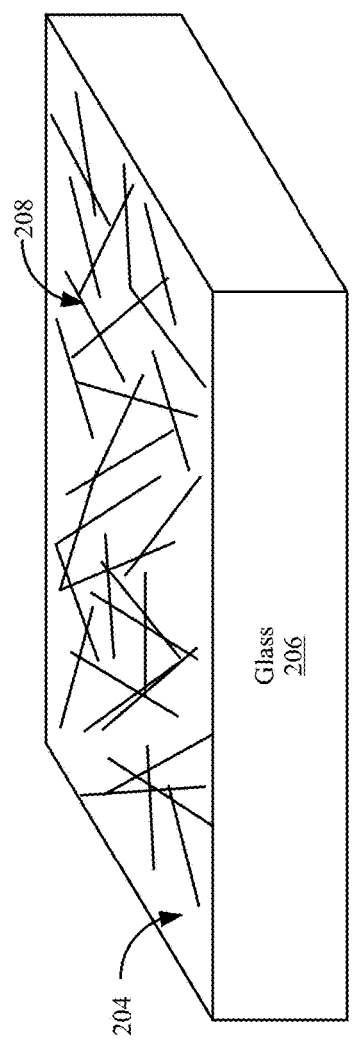

In FIG. 2B, the nanowire suspension 202 is dispersed on the surface 204 to form a nanowire mesh 208. In some embodiments, the nanowire suspension 202 is dispersed by spin coating the nanowire suspension 202 onto the glass transfer block 206. In some embodiments, the nanowire suspension 202 is dispersed by any of the deposition techniques disclosed or referenced herein. The nanowire suspension 202 is subsequently dried to evaporate the solvent leaving behind the nanowire mesh 208. In some embodiments, to prevent nanowire aggregation, the nanowire suspension 202 is dried slowly (e.g., at room temperature) while the glass transfer block 206 is shaken (e.g., moved laterally and/or angularly at a frequency between 1-60 Hz). The nanowire mesh 208 is optionally annealed (e.g., by raising the temperature of the glass transfer block 206 to about 180° C. for a period of about 1 hour) to further fuse (e.g., electrically couple) the nanowires and form a substantially continuous network of the conductive material, thereby reducing sheet resistance of the final transparent conductive film.

Figure 2C:
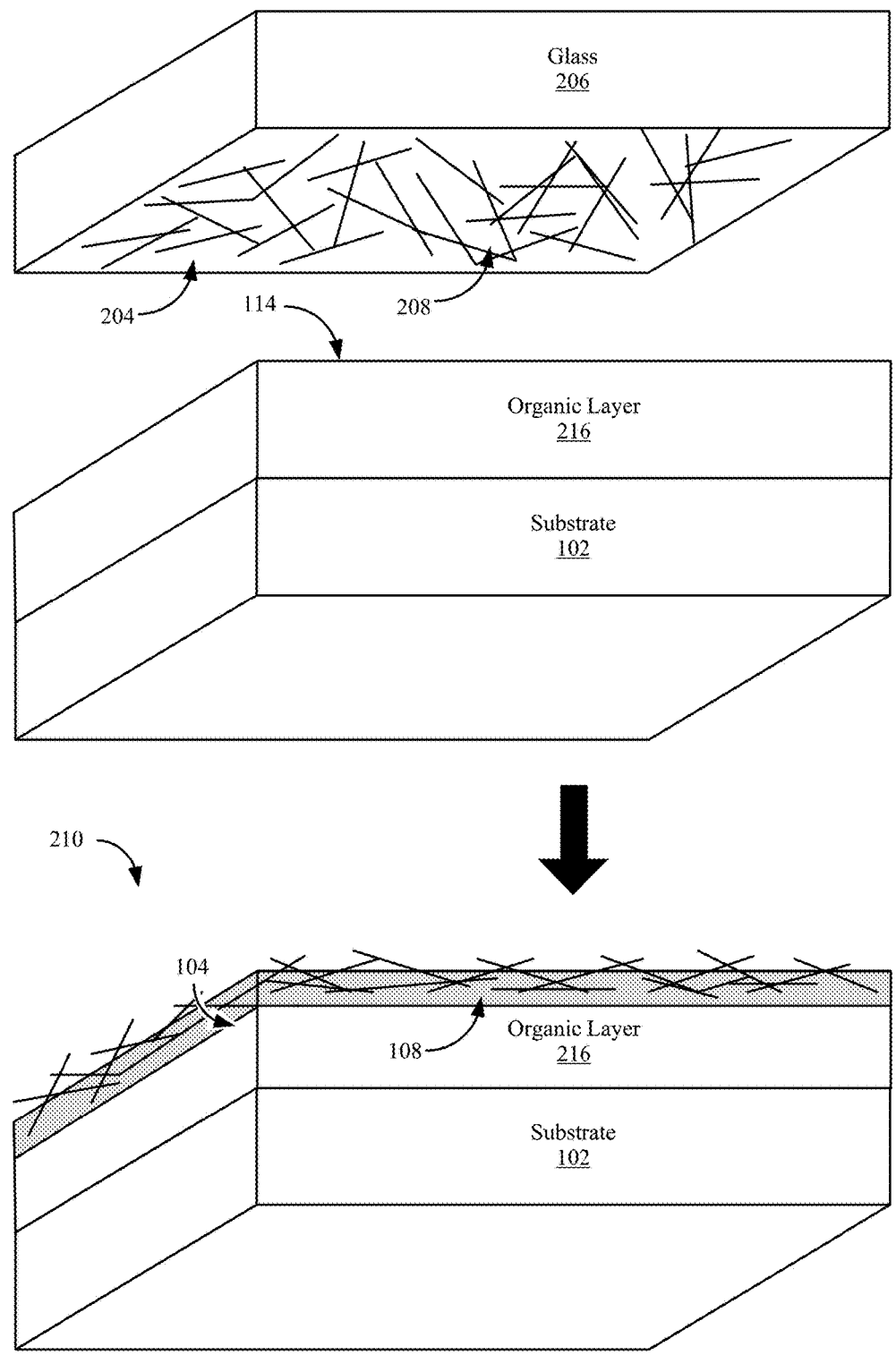

FIG. 2C illustrates an operation in which the surface 204 of the glass transfer block 206 is pressed onto a surface 114 of a layer of organic material 216, which is disposed upon an underlying substrate 102 (e.g., glass or PET). In some embodiments, the organic material is a photoresist. In some embodiments, the organic material 216 is cross-linkable but in a substantially noncross-linked state. In some embodiments, the surface 204 of the glass transfer block 206 is pressed onto the surface 114 of the layer of organic material 216 with a predetermined (e.g., calibrated) pressure (e.g., a pressure of $2.4 \times 10^4$ psi). The method 200 results in a device 210 that includes a nanowire mesh 108 embedded in the layer of organic material 216, thus forming the composite conductive film 104/140.

In some embodiments, the organic layer 216 is a polymer. In some embodiments, the polymer is an electrically insulating material (e.g., the layer of organic material 216 has a sheet resistance above 5000 $\Omega\square^{-1}$). Upon embedding the nanowire mesh 108 in the layer of organic material 216, the composite conductive film 104/140 becomes conducting (e.g., with a sheet resistance less than 100 $\Omega\square^{-1}$ or 200 $\Omega\square^{-1}$).

By applying pressure to the nanowire mesh 108 in this manner, a mechanical force is applied to the nanowires. The mechanical force fuses the nanowires together (e.g., where they are in contact with one another) and fills in the spaces between nanowires with photoresist. Thus, the application of pressure serves to improve electrical conductivity and reduce surface roughness for the resulting device 210. This, in turn, affects both optical and electrical properties of the device 210. For example, the haze of a transparent conductive film (e.g., transparent conductive film 104, FIG. 1A) is proportional to the transparent conductive film's surface roughness because the stacking and projection of the nanowires increases the transparent conductive film's tendency to absorb and/or scatter light. In addition, when the nanowires become fused, the electrical resistance of the transparent conductive film 104 substantially decreases.

As a more detailed example, in some implementations, the nanowires in the nanowire suspension 202 have varying diameters (e.g., ranging between 50-100 nm). Accordingly, diameters of nanowires in the nanowire mesh 208 (e.g., prior to embedding the nanowire mesh 208 in the layer of organic material 216) may vary from one another, with differences upwards of 50 nanometers. In some embodiments, after the surface 204 of the glass transfer block 206 is pressed onto the layer of organic material 216, a composite conductive film 104/140 having a surface roughness that is less than 40 nanometers root-mean-square (RMS) is achieved. In other implementations, the surface roughness is less than about 20 nanometers RMS. More generally, in some embodiments, the composite conductive film 104/140 is characterized by a first surface roughness that is less than a second surface roughness of a stand-alone film (e.g., nanowire mesh 208) consisting of the same thickness of the inorganic mesh. For example, the first surface roughness is about fifty percent less than the second surface roughness.

In some embodiments, one or more parameters (e.g., the applied pressure and/or the composition, length, and/or density of the nanowires) can be varied to deliberately alter (e.g., tune) the transparency and haze of the device 210 for specific applications (e.g., by varying the thickness of surface region 112, FIG. 1A or the surface roughness). Alternatively, or in addition to, in some embodiments, the thickness of the surface region 112 (FIG. 1A and/or FIG. 1B) is selected in accordance with a target conductivity value.

Figure 2D:
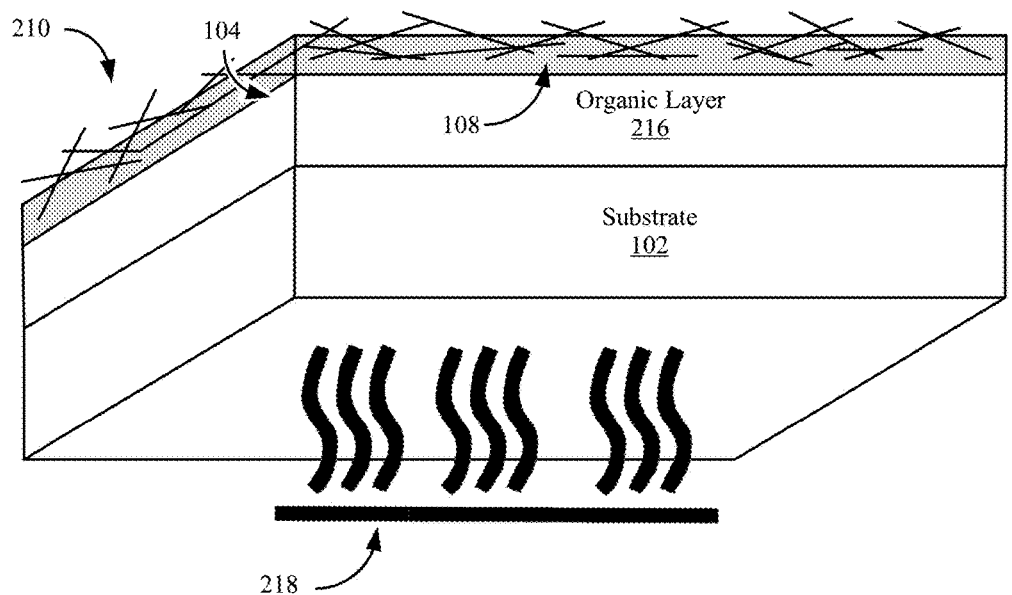

FIG. 2D illustrates an optional operation in which the device 210 is exposed to heat (e.g., cured or annealed using an oven or hot plate 218) in order to cross-link the organic material 216 (e.g., for applications in which an enhanced surface hardness and/or temperature stability is desirable). The exact temperature or range of temperatures at which to heat device 210 depends on the nature of the organic material 216. In some embodiments, the organic material 216 is a polyamide or polyimide that undergoes cross-linking at a temperature that is below its glass transition temperature. For example, some polyimides undergo substantial cross-linking at 350° C.-400° C. The length of exposure to elevated temperature is less critical, but between 1-30 minutes provide reasonable values. In some embodiments, after curing, the composite conductive film is baked for an additional amount of time to evaporate residual solvents. The hardness of the cross-linked organic material 216 translates into a composite conductive film 104/140 that is correspondingly hard.

Figure 2E:
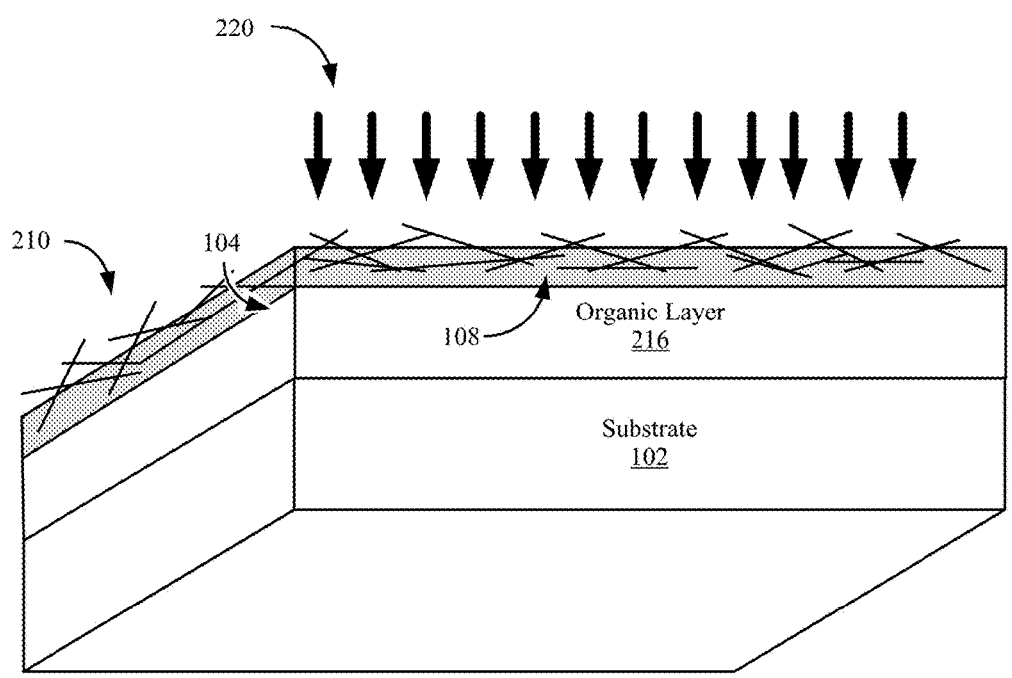

FIG. 2E illustrates an optional alternate operation for cross-linking polymers within organic material 216. Namely, FIG. 2E illustrates an operation in which the device 210 is exposed to ultraviolet (UV) radiation (e.g., using a UV source 220) in order to cross-link the organic material 216 (e.g., for applications in which an enhanced surface hardness and/or temperature stability is desirable). In some embodiments, a dose of between 6-12 Mrad of UV radiation is impinged upon the surface 112 of the composite conductive film 104/140 to achieve the cross-linking. In some embodiments, the cross-linking is improved by mixing the polymer with a suitable unsaturated radiation cross-linking agent (sometimes called a "pro-rad").

Figure 3A:
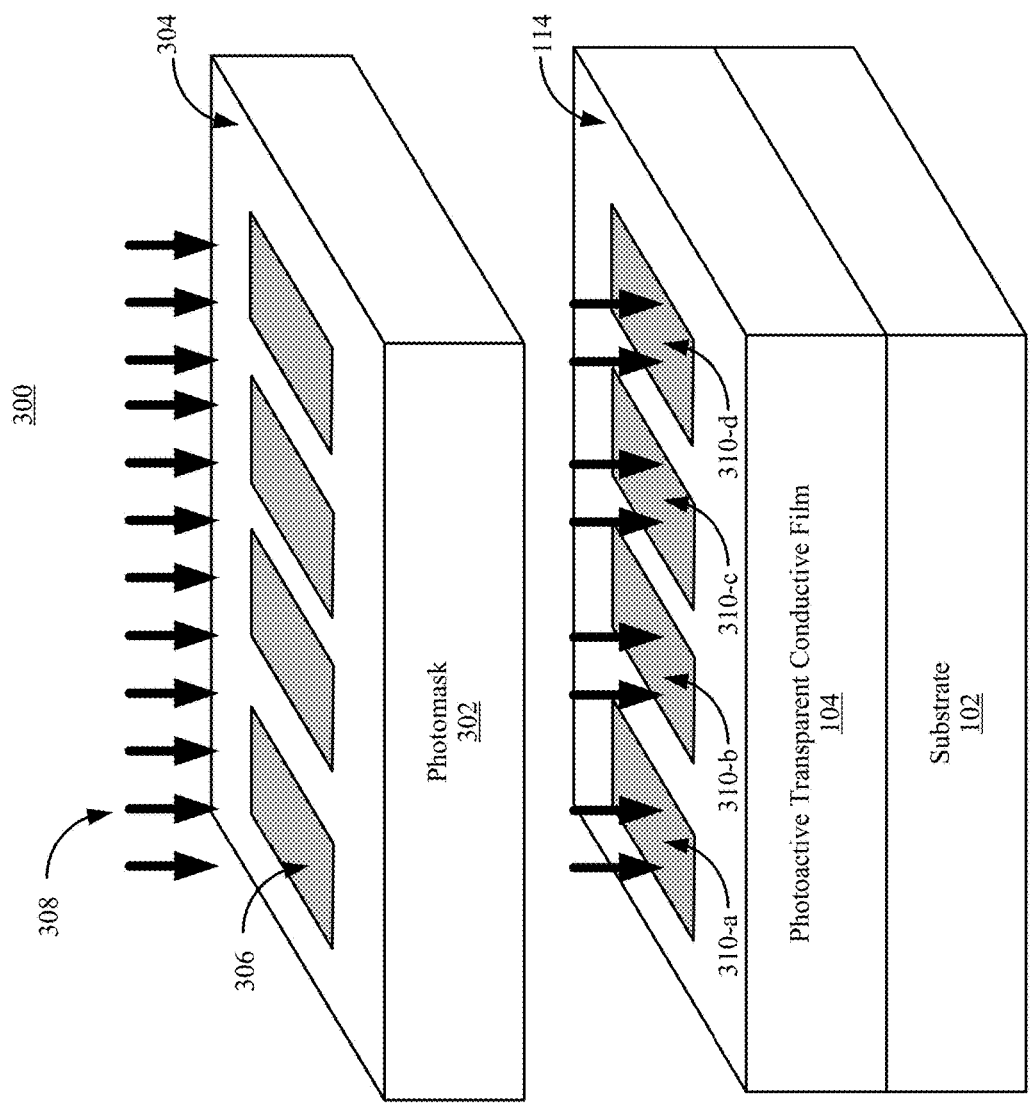
FIGS. 3A-3C illustrate a method of patterning a photoactive transparent conductive film using an abbreviated lithographic process, in accordance with some embodiments.
Figure 3B:
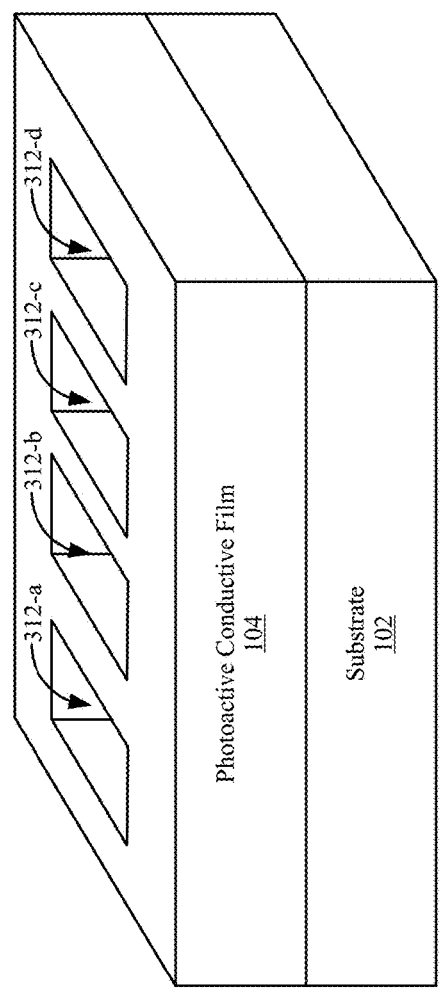
Figure 3C:
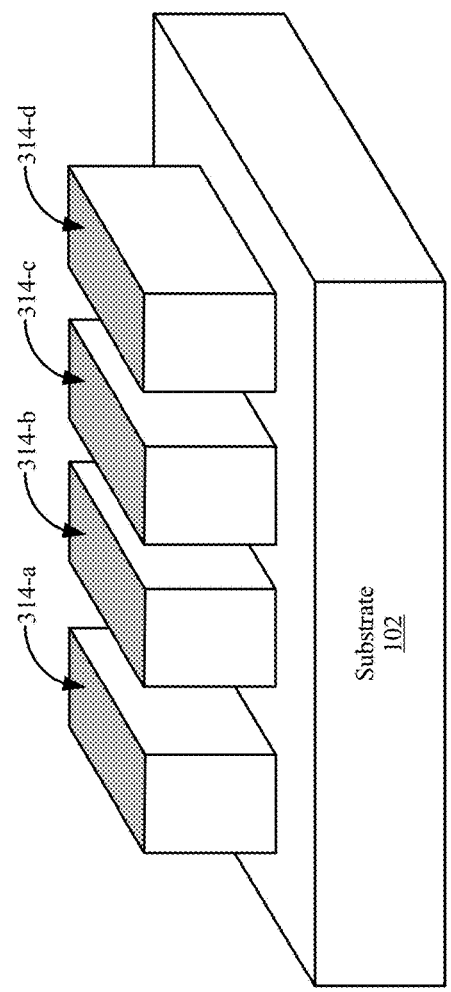

FIGS. 3A-3C illustrate a method 300 of patterning a transparent conductive film 104 using an abbreviated lithographic process, in accordance with some embodiments.

In FIG. 3A, a photomask 302 is positioned with respect to the conductive surface of a photoactive transparent conductive film 104 (e.g., the photomask 302 is either in contact with the photoactive transparent conductive film 104 or separated from the photoactive transparent conductive film 104 by a predetermined distance). In some embodiments, the photomask is a stepper reticle and, when in use, one or more optical elements (not shown) are disposed between photomask 302 and the transparent conductive film 104. In other embodiments, the photomask 302 is a contact printing photomask and, when in use, photomask 302 is in contact with or very close to (e.g., 1 micron, or 2 microns away from) the transparent conductive film 104. Transparent conductive film 104 is described herein as a "photoactive" transparent conductive film because, prior to outset of method 300, the photoresist included in the transparent conductive film 104 has not been exposed to light to which the photoresist is sensitive. The photomask 302 has one or more opaque regions 304 that block light and one or more transparent region 306 which allow light to pass onto the surface 114 of the photoactive transparent conductive film 104.

The photomask 302 is illuminated with light 308 having a predetermined wavelength or range of wavelengths. The photoactive transparent conductive film 104 is sensitive to light of the predetermined wavelength or range of wavelengths. The photomask 302 is illuminated in this manner with a predetermined intensity for a predetermined amount of time in accordance with process requirements and recipes. In some embodiments, the predetermined wavelength is in a range of ultraviolet (UV) wavelengths (e.g., 200-270 nm for deep-UV, or 300-400 nm for near-UV). In some embodiments, the predetermined wavelength is distinct from (e.g., outside a range of) wavelengths for which the transparent conductive film 104 is intended to be transparent.

The transparent regions 306 result in the exposure of selected regions 310 (e.g., regions 310-a, 310-b, 310-c, and 310-d) of the photoactive transparent conductive film 104 to light having the predetermined wavelength. In some embodiments, the photoresist material is a positive photoresist. The positive resist is relatively insoluble. After exposure to the proper light energy, the resist converts to a more soluble state. This reaction is called photosobulization. In some embodiments, the photoresist material is a positive photoresist that is degraded by exposure of light having the predetermined wavelength. For example, the photoresist, prior to exposure to light, is characterized by cross-linking of polymers. The cross-linking of polymers is broken in the first region (e.g., scissions are formed and the polymers are de-crosslinked) to form a noncross-linked state by exposure to light having the predetermined wavelength.

FIG. 3B illustrates the result of the method 300 when a positive photoresist is used. When a positive photoresist is used, the selected regions 310 are removed upon application of a developer to form, for example, trenches 312 (e.g., trenches 312-a, 312-b, 312-c, and 312-d), while the unexposed regions are not removed.

In some embodiments, the photoresist is a negative photoresist in which polymers in the resist form a cross-linked material that is etch resistant upon exposure to light. In some embodiments, the photoresist is a negative photoresist comprising a polymer and exposing the selected regions 310 of the photoactive transparent conductive film 104 to light having the predetermined wavelength results in crosslinking of the polymer. When a negative photoresist is used, the selected regions 310 remain upon application of a developer, while unexposed regions are removed.

FIG. 3C illustrates the result of the method 300 when a negative photoresist is used. When a negative photoresist is used, the selected regions 310 remain (i.e., are not removed) upon application of a developer to form, for example, pillars 314 (e.g., pillars 314-a, 314-b, 314-c, and 314-d), while the unexposed regions are removed.

In some circumstances (e.g., for some photoresists), the cross-linking of the polymer is driven by thermal processes activated by the UV radiation (e.g., the UV radiation locally increases the temperature of the photoresist, which drives the cross-linking process). In some circumstances, the transparent conductive film 104 does not include a photoresist, but is nonetheless a layer of a material that undergoes cross-linking when exposed to elevated temperature (e.g., thermal cross-linking). Such materials can be beneficial when mechanical robustness is desired (e.g., without the need for patterning). In some embodiments, the transparent conductive film 104 includes an electron-beam (e-beam) sensitive resist in lieu of a photoresist (however, PMMA is considered both an e-beam resist and a photoresist sensitive to UV light). In some embodiments, the transparent conductive film 104 is deposited using monomers or oligomers in solution, and a catalyst is added to the solution to facilitate cross-linking (e.g., prior to depositing the solution onto the substrate, drying the solution to form the layer, and embedding the wires into the surface of the layer).

Although removal of the unwanted regions of the photoresist (e.g., the unexposed regions or, alternatively, the exposed regions, depending on the nature of the photoresist) has been described with reference to use of a developer, some embodiments utilize a mechanical approach to removing such regions. Such mechanical approaches can include an applied force or blasting with a fluid such as air or water.

Figure 4A:
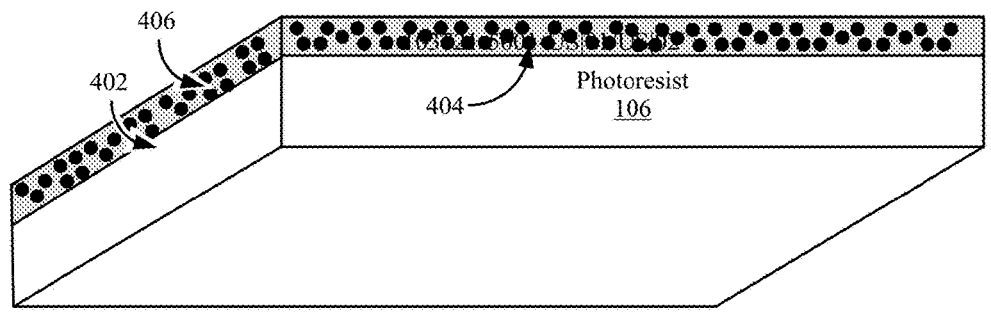
FIGS. 4A-4C illustrate various embodiments of a transparent conductive film.
Figure 4B:
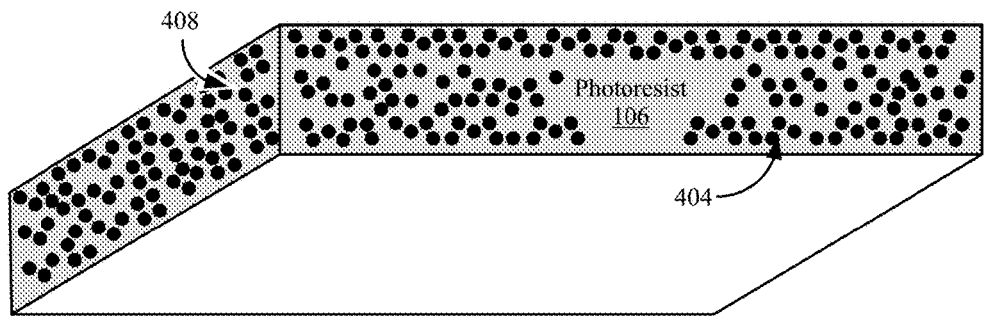
Figure 4C:
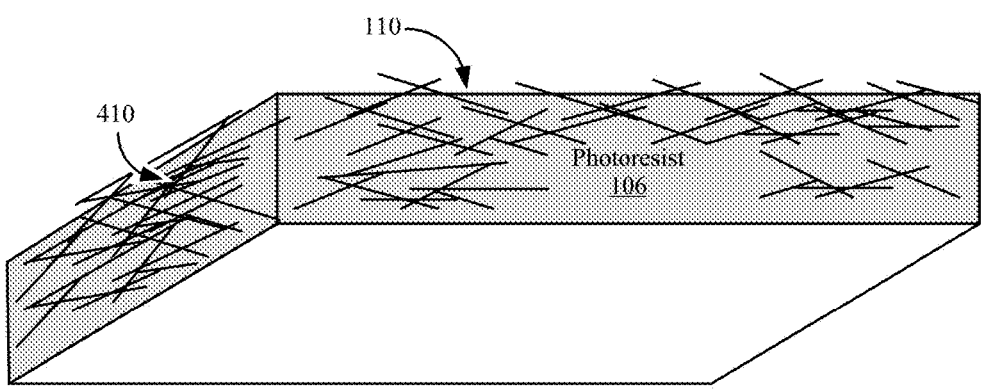

FIGS. 4A-4C illustrate alternate embodiments of a transparent conductive film. In some embodiments, the layers of photoresist material 106 shown in FIGS. 4A-4C are disposed upon a substrate (e.g., substrate 102, FIG. 1A), although the substrate is not shown here for visual clarity. The transparent conductive films illustrated in FIG. 4A-4C are intended to be only exemplary and are not intended to limit the claims that follow.

FIG. 4A illustrates a transparent conductive film 402. The transparent conductive film 402 is a composite conductive film that includes a layer of photoresist material 106 and an inorganic mesh comprising a plurality of nanospheres 404 (e.g., metallic nanospheres). The inorganic mesh is confined to a surface region 406 of the transparent conductive film 402, which is advantageous in that fewer nanospheres 404 are required to achieve a suitable sheet resistance, resulting in improved transparency characteristics.

FIG. 4B illustrates a transparent conductive film 408. In an analogous manner to FIG. 4A, the transparent conductive film 408 is a composite conductive film that includes a layer of photoresist material 106 and an inorganic mesh comprising a plurality of nanospheres 404 (e.g., metallic nanospheres). Unlike in FIG. 4A, however, the inorganic mesh is not confined to a surface region of the transparent conductive film 408 and is instead suspended throughout the bulk of the layer of photoresist material 106. The transparent conductive film 408 can be used when a high degree of transparency is not needed (or a hazy film is desired) or when a high degree of conductivity is not needed.

FIG. 4C illustrates a transparent conductive film 410. FIG. 4C is analogous to FIG. 4B but for the fact that transparent conductive film 410 includes an inorganic mesh comprising a plurality of nanowires 110 suspended throughout the bulk of the layer of photoresist material 106.

Figure 5:
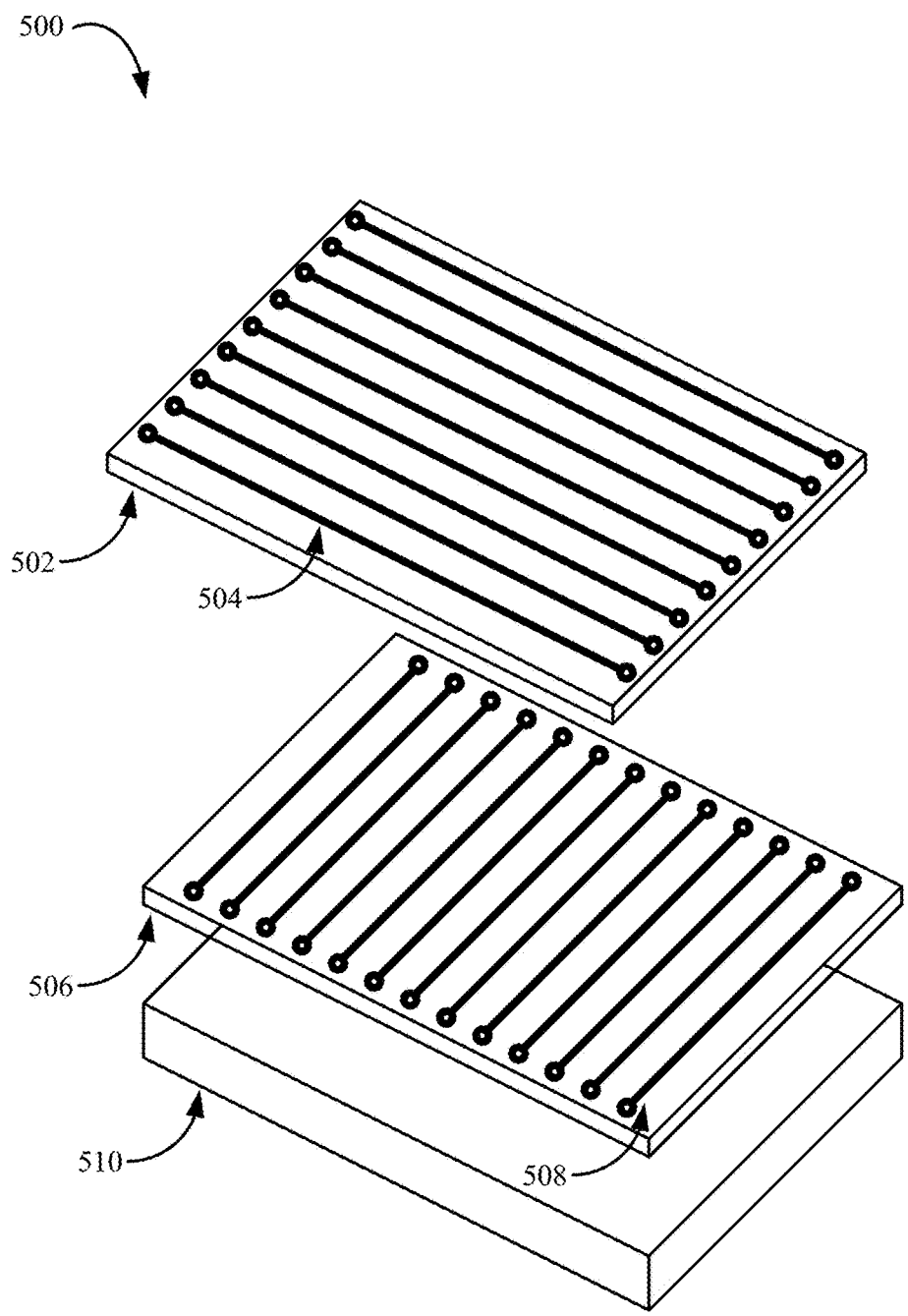
FIG. 5 illustrates a touch-sensitive device having conductive lines made of a transparent conductive film, in accordance with some embodiments.

FIG. 5 illustrates a touch-sensitive device 500 having conductive lines of a transparent conductive film, in accordance with some embodiments. FIG. 5 illustrates several layers, panels, and/or components of the touch-sensitive device 500. For visual clarity, these layers are illustrated as separated in the vertical direction. More typically, these layers will be connected to one another or, alternatively, coupled with one another (e.g., with spacer layers in between).

The touch-sensitive device 500 includes a driving panel 502 which has a plurality of conductive driving lines 504 patterned upon a surface of the driving panel 502 (e.g., a top surface). Each of the plurality of conducting driving lines 504 can have any of the properties or features of the distinct instances of the transparent conductive film 104 described with reference to any of the other figures (e.g., FIG. 1A). In some embodiments, the device 100-a illustrated in FIG. 1A is a partial cross-section of driving panel 502. In particular, each of the plurality of driving lines 504 comprises a layer of photoresist material and an inorganic mesh that includes a plurality of particles embedded within the layer of photoresist material.

The touch-sensitive device 500 further includes a sensing panel 506 electrically coupled with the driving panel 502 by an electrical characteristic (e.g., capacitance, resistance) having a value. The sensing panel 506 includes a plurality of sensing lines 508 disposed upon a surface of the sensing panel. In some embodiments, the sensing lines 508 are analogous to the driving lines 504, except that the sensing lines 508 run in a different direction (e.g., substantially perpendicularly) to the driving lines 504 such that the two sets of lines form a grid.

The touch-sensitive device 500 further includes electronic circuitry to detect, using the plurality of driving lines 504 and the plurality of sensing lines 508, a touch input by sensing a change in the value of the electrical characteristic (e.g., capacitance or resistance) between the driving panel 502 and the sensing panel 506.

Finally, the touch-sensitive device 500 includes a display 510 (e.g., an LCD display). The display 510 produces light that is shone upwards through the driving panel 502 and sensing panel 506.

In some embodiments, the conductive lines are straight lines. Alternatively, the conductive lines (e.g., driving lines 504 or sensing lines 508) can have an arbitrary shape.

Figure 6A:
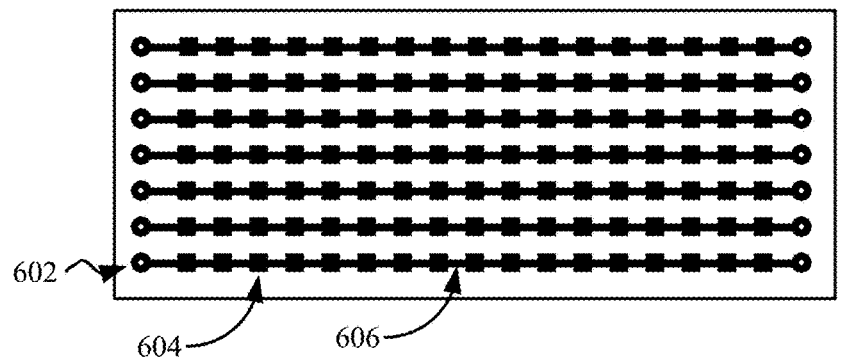
FIGS. 6A-6C illustrate examples of conductive line shapes, in accordance with some embodiments.
Figure 6B:
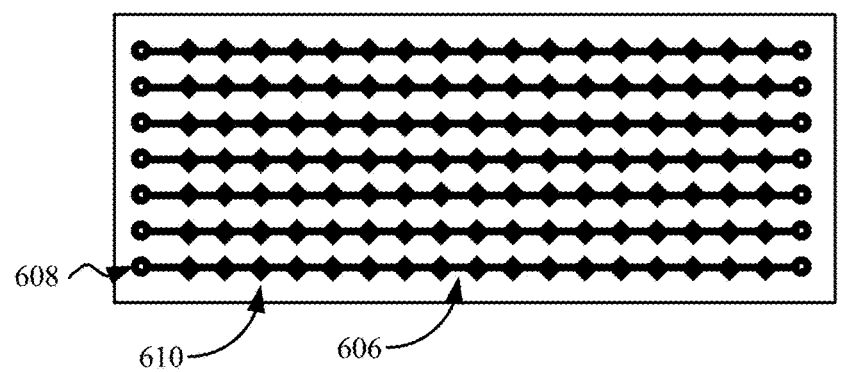
Figure 6C:
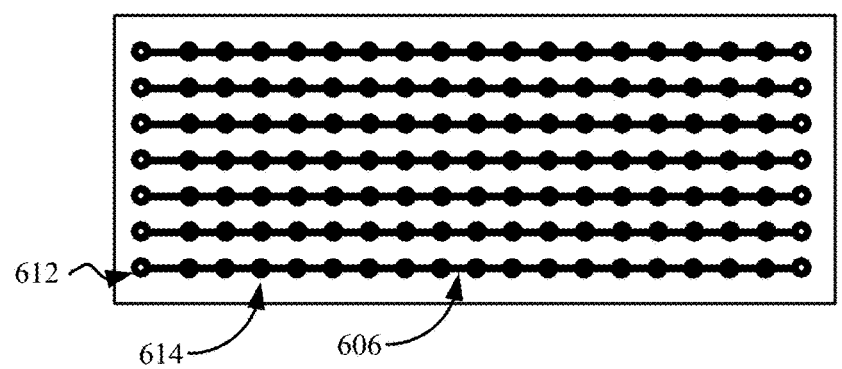

FIGS. 6A-6C illustrate examples of conductive line shapes, in accordance with some embodiments. FIG. 6A illustrates conductive lines 602 comprising a plurality of rectangles 604 separated by straight segments 606 of the transparent conductive film. FIG. 6B illustrates conductive lines 608 comprising a plurality of diamonds 610 separated by straight segments 606 of the transparent conductive film. FIG. 6C illustrates conductive lines 612 comprising a plurality of circles 614 separated by straight segments 606 of the transparent conductive film.

Figure 7A:
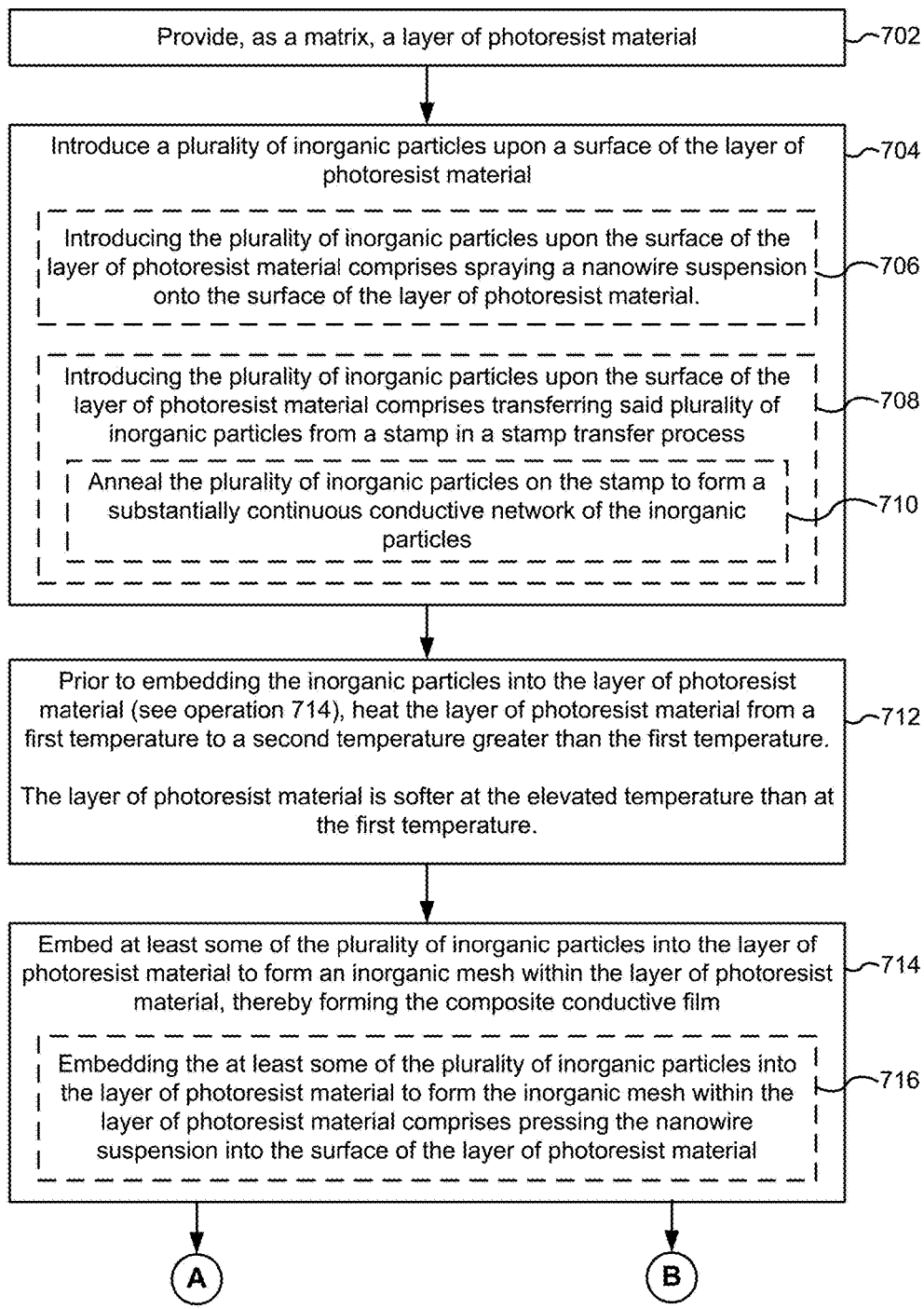
FIGS. 7A-7B are a flowchart illustrating a method of fabricating a photoactive composite conductive film, in accordance with some embodiments.
Figure 7B:
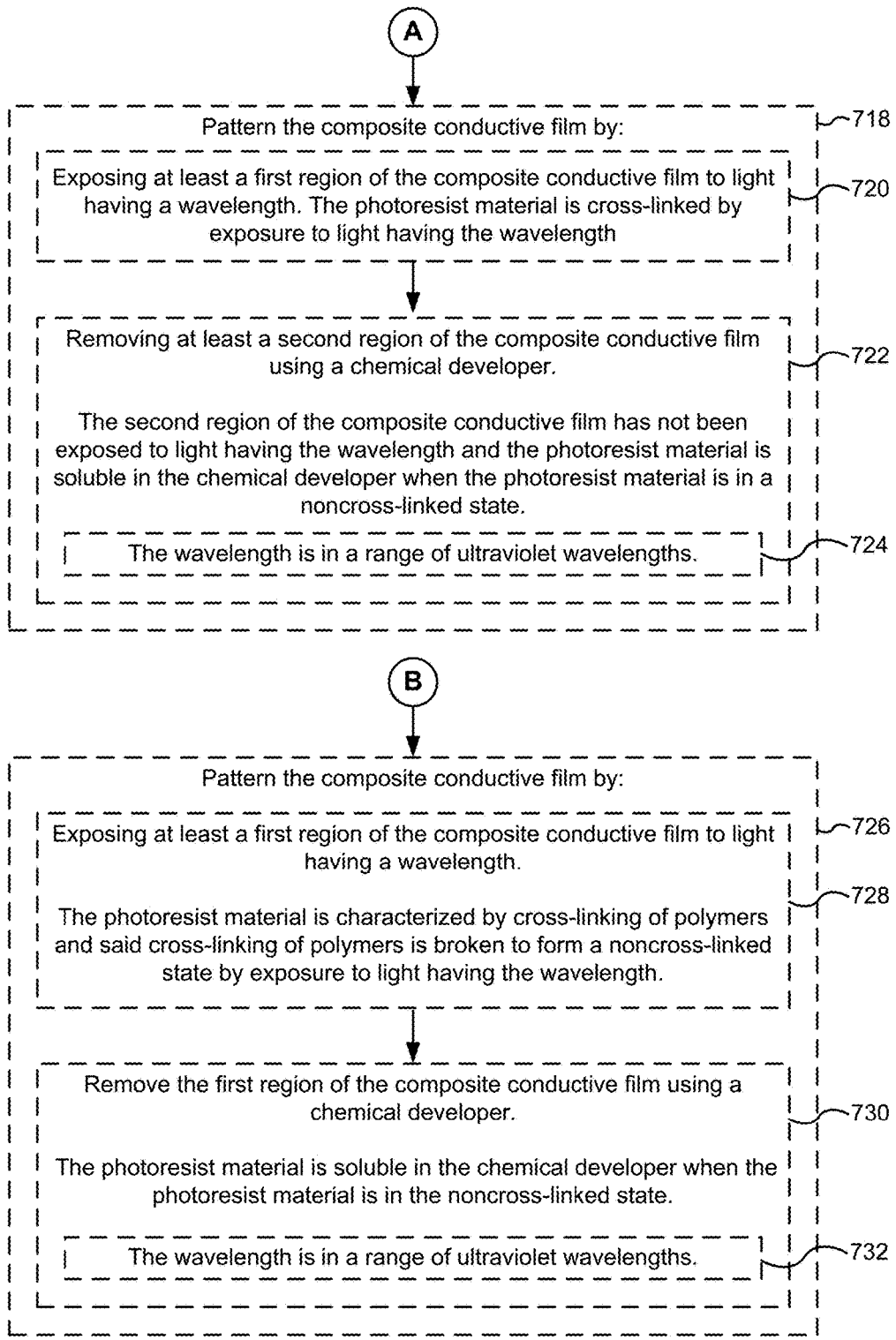

FIGS. 7A-7B are a flowchart illustrating a method 700 of fabricating a composite conductive film. The method 700 can be used to fabricate the composite conductive film shown, for example, in FIG. 1A, and/or the conductive driving lines/conductive sensing lines shown in FIG. 5 and FIG. 6.

The method 700 includes providing (702), as a matrix, a layer of photoresist material. For example, in some embodiments, the layer of photoresist material is spin-coated onto a glass substrate (e.g., substrate 102, FIG. 1A). In some embodiments, the photoresist material is an electrically insulating material (e.g., with a sheet resistance above 5000 $\Omega\square^{-1}$).

The method 700 further includes introducing (704) a plurality of inorganic particles upon a surface (e.g., a top surface) of the layer of photoresist material. In some embodiments, the plurality of inorganic particles comprise one of nanowires (as shown in FIG. 1A), nanotubes, nanospheres, graphene, or a combination (e.g., heterogeneous mixture) thereof. In some embodiments, introducing the plurality of inorganic particles upon the surface of the layer of photoresist material comprises spraying (706) a nanowire suspension onto the surface of the layer of photoresist material. In some embodiments, introducing the plurality of inorganic particles upon the surface of the layer of photoresist material comprises transferring (708) said plurality of inorganic particles from a stamp (e.g., glass transfer block 206, FIG. 2) in a stamp transfer process (e.g., by the process shown in FIGS. 2A-2C). In some embodiments, prior to introducing the plurality of inorganic particles upon the surface of the layer of photoresist material, the method 700 includes annealing (710) the plurality of inorganic particles on the stamp to form a substantially continuous conductive network of the inorganic particles. For example, the stamp can be raised to an elevated temperature of 180° C. for a predetermined period of time (e.g., 1 hour) to anneal the plurality of particles.

In some embodiments, prior to embedding the inorganic particles into the layer of photoresist material (see operation 714), the method 700 includes heating (712) the layer of photoresist material from a first temperature (e.g., room temperature, or 25° C.) to a second temperature (e.g., 90° C.) greater than the first temperature. The layer of photoresist material is softer at the second temperature than at the first temperature, thereby facilitating the embedding operation 714).

The method 700 includes embedding (714) at least some of the plurality of inorganic particles into the layer of photoresist material to form an inorganic mesh within the layer of photoresist material, thereby forming the composite conductive film. In some embodiments, embedding the at least some of the plurality of inorganic particles into the layer of photoresist material to form the inorganic mesh within the layer of photoresist material comprises pressing (716) the nanowire suspension into the surface of the layer of photoresist material (e.g., by pressing the stamp into the surface of the layer of photoresist material with a pressure of $2.4 \times 10^4$ psi).

In some embodiments, the method 700 includes patterning (718) the composite conductive film by exposing (720) at least a first region of the composite conductive film to light having a wavelength. The photoresist material is cross-linked by exposure to light having the wavelength (e.g., the photoresist material is a negative photoresist). In some embodiments, patterning the composite conductive film further comprises removing (722) at least a second region of the composite conductive film using a chemical developer. The second region of the composite conductive film has not been exposed to light having the wavelength and the photoresist material is soluble in the chemical developer when the photoresist material is in a noncross-linked state. In some embodiments (724), the wavelength is in a range of ultraviolet wavelengths (e.g., in a range of 200-270 nm for deep-UV or 300-400 for near-UV).

In some embodiments, the method further includes patterning (726) the composite conductive film by exposing (728) at least a first region of the composite conductive film to light having a wavelength. The photoresist material is characterized by cross-linking of polymers and said cross-linking of polymers is broken to form a noncross-linked state by exposure to light having the wavelength (e.g., the photoresist material is a positive photoresist). In some embodiments, patterning the composite conductive film further comprises removing (730) the first region of the composite conductive film using a chemical developer. The photoresist material is soluble in the chemical developer when the photoresist material is in the noncross-linked state. In some embodiments (732), the wavelength is in a range of ultraviolet wavelengths (e.g., in a range of 200-270 nm for deep-UV or 300-400 for near-UV).

Figure 8:
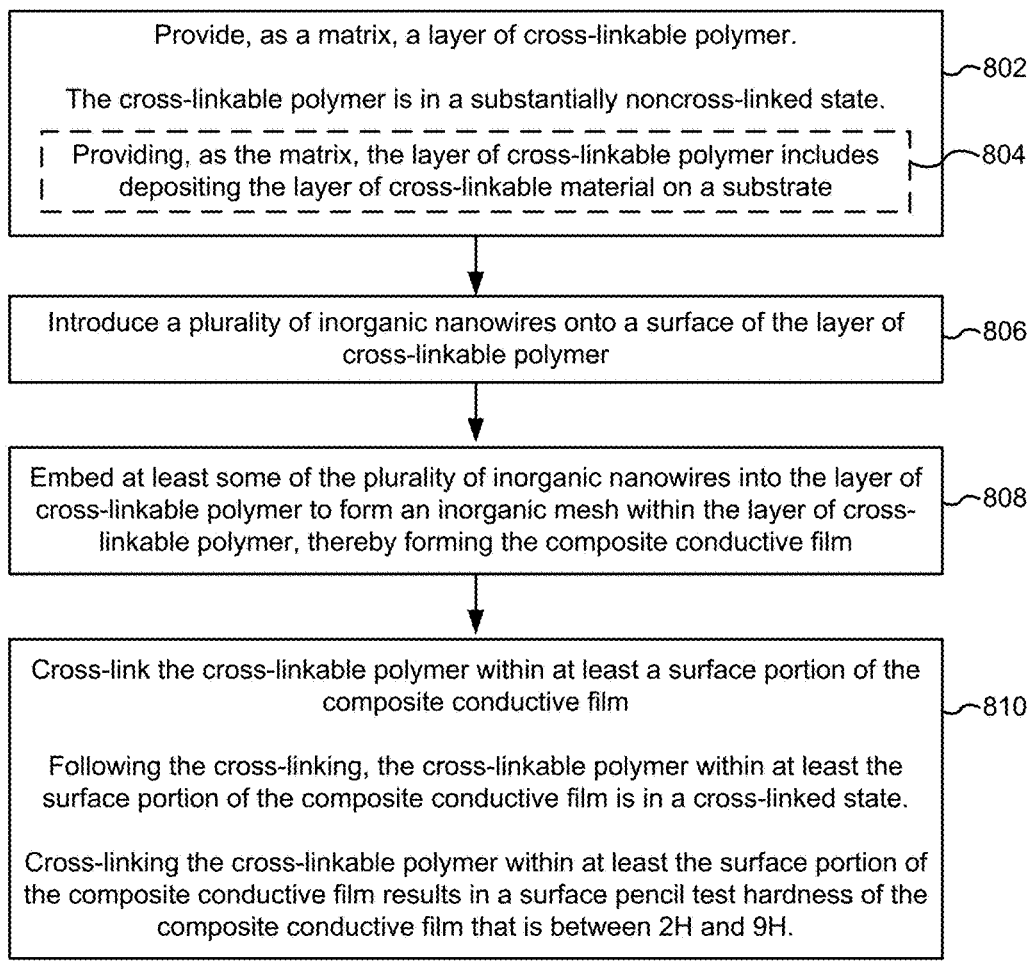
FIG. 8 is a flowchart illustrating a method of fabricating a composite conductive film with enhanced hardness, in accordance with some embodiments.

FIG. 8 is a flowchart illustrating a method 800 of fabricating a composite conductive film with enhanced hardness.

The method includes providing (802), as a matrix, a layer of cross-linkable polymer. The cross-linkable polymer is in a substantially noncross-linked state. In some embodiments, providing, as the matrix, the layer of cross-linkable polymer includes depositing (804) the layer of cross-linkable material on a substrate. Thus, in some embodiments, the composite conductive film is disposed on a substrate. In various embodiments, the substrate is one of a polyester substrate or a borosilicate glass substrate. The cross-linkable polymer deposited on the substrate is sometimes called a "precursor." Various methods of depositing the layer of cross-linkable material on the substrate (e.g., spin-coating) are described elsewhere in this document. In some embodiments, the cross-linkable polymer is deposited as a liquid film. In some embodiments, the cross-linkable polymer is a polyamide or a polyimide. In some embodiments, the cross-linkable polymer is one of an acrylated polyurethane or an epoxy-based alkyl-amine.

The method further includes introducing (806) a plurality of inorganic nanowires onto a surface of the layer of cross-linkable polymer. For example, the plurality of inorganic nanowires are sometimes formed on a sacrificial superstrate (e.g., glass transfer block 206) and then laminated onto the liquid film of the precursor. The method further includes embedding (808) at least some of the plurality of inorganic nanowires into the layer of cross-linkable polymer to form an inorganic mesh within the layer of cross-linkable polymer, thereby forming the composite conductive film. In some embodiments, the operation of introducing the inorganic nanowires and embedding the inorganic nanowires are one and the same. For example, the superstrate is placed in contact with the liquid film thereby embedding the nanowires within the liquid film.

In some embodiments, the respective inorganic nanowires of the plurality of inorganic nanowires of the inorganic mesh comprise a material having a conductivity between $1 \times 10^5$ S/cm and $1 \times 10^6$ S/cm, or greater. For example, in some embodiments, the respective inorganic nanowires comprise silver (Ag) with a conductivity of approximately $6 \times 10^5$ S/cm. The plurality of nanowires has an average aspect ratio between 10-1000.

The method further includes cross-linking (810) the cross-linkable polymer within at least a surface portion of the composite conductive film. For example, the cross-linkable polymer comprises is a material that undergoes cross-linking when exposed to one of ultraviolet (UV) radiation, heat treatment, or a chemical catalyst. Following the cross-linking, the cross-linkable polymer within at least the surface portion of the composite conductive film is in a cross-linked state. Cross-linking the cross-linkable polymer within at least the surface portion of the composite conductive film results in a surface pencil test hardness of the composite conductive film that is between 2H and 9H.

In some embodiments, a method is provided that is analogous to method 800 except that, rather than (or in addition to) producing a composite conductive film with enhanced hardness properties, the operation of cross-linking the cross-linkable polymer within at least the surface portion of the composite conductive film results in at least the surface portion of the composite conductive film having a second conductivity stability temperature that is greater than a first conductivity stability temperature, where the nanowires of the inorganic material are, in isolated form, characterized by the first conductivity stability temperature. In some embodiments, the first conductivity stability temperature of the nanowires is a threshold that, when surpassed, causes a substantial reduction in the conductivity of the isolated nanowire mesh (e.g., causes a phase transition). In some circumstances, this reduction in conductivity persists even when the temperature is subsequently reduced below the first conductivity stability temperature. In some embodiments, the second conductivity is a threshold that, when surpassed, causes a substantial reduction the conductivity of the embedded nanowire mesh (e.g., causes a phase transition). In some embodiments, the first conductivity stability temperature is less than a bulk conductivity stability temperature (e.g., a bulk melting temperature) of the inorganic material (e.g., silver). In some embodiments, the first conductivity stability temperature is a temperature at which the nanowires change shape (e.g., "bead up").

In some embodiments, the composite conductive film is characterized by a sheet resistance having a temperature coefficient (e.g., an average temperature coefficient) that is less than 0.002 $(\Omega K)^{-1}$ between the first conductivity stability temperature and the second conductivity stability temperature.

In some embodiments, the layer of cross-linked polymer comprises one of a silicone material, a polyamide material, or a polyimide material.

The foregoing description, for purposes of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

It will be understood that, although the terms "first," "second," etc. may be used herein to describe various elements, these elements should not be limited by these terms. These terms are only used to distinguish one element from another. For example, a first instance of a layer of material could be termed a second instance of the layer of material, and, similarly, a second first instance of the layer of material could be termed a first instance of the layer of material, without changing the meaning of the description, so long as all occurrences of the "first instance of the layer of material" are renamed consistently and all occurrences of the "second instance of the layer of material" are renamed consistently. The first instance of the layer of material and the second first instance of the layer of material are both instances of the layer of material, but they are not the same instance of the layer of material.

The terminology used herein is for the purpose of describing particular implementations only and is not intended to be limiting of the claims. As used in the description of the implementations and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "upon a determination that" or "in response to determining" or "in accordance with a determination" or "upon detecting" or "in response to detecting" that the stated condition precedent is true, depending on the context.

What is claimed is:

1. A method of fabricating a composite conductive film, comprising:
    providing, as a matrix, a layer of cross-linkable material, wherein the layer of the cross-linkable material has a surface and is in a non-cross-linked state;
    applying a plurality of inorganic nanowires to a surface of a sacrificial superstrate, wherein the inorganic nanowires are, in isolated form, characterized by a first conductivity stability temperature;
    embedding at least some of the plurality of inorganic nanowires into the layer of cross-linkable material to form an inorganic mesh within the layer of cross-linkable material, thereby forming the composite conductive film, wherein embedding the at least some of the plurality of inorganic nanowires into the layer of the cross-linkable material comprises:
        laminating the surface of the sacrificial superstrate to the surface of the layer of the cross-linkable material, wherein the layer of the cross-linkable material is in a liquid state when the surface of the sacrificial superstrate is laminated to the surface of the layer of the cross-linkable material;
    while the surface of the sacrificial substrate is laminated to the surface of the layer of the cross-linkable material, cross-linking the cross-linkable material within at least a surface portion of the composite conductive film, wherein following the cross-linking, the cross-linkable material within at least the surface portion of the composite conductive film is in a cross-linked state; and
    after cross-linking the cross-linkable material within at least a surface portion of the composite conductive film, removing the sacrificial superstrate;
    wherein cross-linking the cross-linkable material within at least the surface portion of the composite conductive film results in at least the surface portion of the composite conductive film having a second conductivity stability temperature that is greater than the first conductivity stability temperature;
    wherein, prior to the cross-linking, the cross-linkable material comprises monomers and/or oligomers; and
    wherein the composite conductive film is characterized by a sheet resistance having a temperature coefficient that is less than 0.002 $(\Omega K)^{-1}$ between the first conductivity stability temperature and the second conductivity stability temperature.

2. The method of claim 1, wherein the plurality of nanowires has an average aspect ratio between 10-1000.

3. The method of claim 1, wherein the layer of cross-linkable material comprises one of an acrylated polyurethane or an epoxy-based alkyl-amine.

4. The method of claim 1, wherein providing, as the matrix, the layer of cross-linkable material includes depositing the layer of cross-linkable material on a second substrate different from the sacrificial substrate.

5. The method of claim 4, wherein the second substrate is one of a polyester substrate or a borosilicate glass substrate.

6. The method of claim 1, wherein the layer of cross-linkable material undergoes cross-linking when exposed to one of ultraviolet (UV) radiation, heat treatment, or a chemical catalyst.

7. The method of claim 1, wherein laminating the surface of the sacrificial superstrate to the surface of the layer of the cross-linkable material comprises:

applying a predefined pressure between the surface of the sacrificial superstrate and the surface of the layer of the cross-linkable material.

* * * * *